(12) United States Patent
An et al.

(10) Patent No.: US 12,074,248 B2
(45) Date of Patent: Aug. 27, 2024

(54) LED TRANSFER METHOD AND MANUFACTURING METHOD OF DISPLAY DEVICE USING THE SAME

(71) Applicant: LG DISPLAY CO., LTD., Seoul (KR)

(72) Inventors: ChungHwan An, Goyang-si (KR); JinWoo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 163 days.

(21) Appl. No.: 17/534,236

(22) Filed: Nov. 23, 2021

(65) Prior Publication Data

US 2022/0173269 A1 Jun. 2, 2022

(30) Foreign Application Priority Data

Dec. 2, 2020 (KR) .................. 10-2020-0166705

(51) Int. Cl.
*H01L 33/00* (2010.01)
*H01L 25/075* (2006.01)
*H01L 33/20* (2010.01)

(52) U.S. Cl.
CPC ...... *H01L 33/0093* (2020.05); *H01L 25/0753* (2013.01); *H01L 33/20* (2013.01)

(58) Field of Classification Search
None
See application file for complete search history.

(56) References Cited

U.S. PATENT DOCUMENTS

| 2014/0209250 A1 | 7/2014 | Kawagoe et al. |
| 2015/0087088 A1 | 3/2015 | Fujimori et al. |
| 2018/0122836 A1 | 5/2018 | Kang et al. |
| 2018/0175268 A1 | 6/2018 | Moon et al. |
| 2018/0204973 A1* | 7/2018 | Jeung .................. H01L 33/0093 |
| 2019/0157501 A1 | 5/2019 | An |
| 2019/0221466 A1 | 7/2019 | Arai |

(Continued)

FOREIGN PATENT DOCUMENTS

| CN | 107851685 A | 3/2018 |
| JP | H06-216497 A | 8/1994 |

(Continued)

OTHER PUBLICATIONS

Office Action dated Jan. 10, 2023, in counterpart Japanese Patent Application No. 2021-195228.

(Continued)

*Primary Examiner* — Bradley Smith
(74) *Attorney, Agent, or Firm* — Morgan, Lewis & Bockius LLP

(57) ABSTRACT

A light emitting diode transfer method includes bonding a rigid substrate on which a plurality of light emitting diodes are formed and a flexible substrate, transferring the plurality of light emitting diodes to the flexible substrate, and detaching the rigid substrate and the flexible substrate. The detaching of the rigid substrate and the flexible substrate includes separating the rigid substrate and the flexible substrate in a state in which one surface of the rigid substrate is fixed and a portion among outermost portions of the flexible substrate is fixed by a fixing member. Accordingly, it is possible to reduce transfer defects of the plurality of light emitting diodes by detaching the flexible substrate and the rigid substrate in a line-by-line separation method.

14 Claims, 14 Drawing Sheets

(56) References Cited

U.S. PATENT DOCUMENTS

| | | |
|---|---|---|
| 2020/0168777 A1 | 5/2020 | Kang |
| 2020/0203165 A1* | 6/2020 | Wagenleitner ...... H01L 21/2007 |
| 2020/0212026 A1 | 7/2020 | Son et al. |
| 2021/0296293 A1 | 9/2021 | Kanaya |

FOREIGN PATENT DOCUMENTS

| | | |
|---|---|---|
| JP | 2001-35972 A | 2/2001 |
| JP | 2009-295853 A | 12/2009 |
| JP | 2018-101785 A | 6/2018 |
| JP | 2020-017580 A | 1/2020 |
| JP | 2020-043209 A | 3/2020 |
| JP | 2020-086154 A | 6/2020 |
| JP | 2020-088392 A | 6/2020 |
| KR | 10-2002-0058523 A | 7/2002 |
| KR | 10-2005-0063142 A | 6/2005 |
| KR | 20-2013-0000985 U | 2/2013 |
| KR | 10-2014-0098007 A | 8/2014 |
| WO | 2013179764 A1 | 12/2013 |
| WO | 2020059588 A1 | 3/2020 |
| WO | 2020-226044 A1 | 11/2020 |

OTHER PUBLICATIONS

Notice of Allowance dated May 9, 2023, in counterpart Japanese Patent Application No. 2021-195228.

Office Action issued in JP application 2023-094581 dated Mar. 19, 2024.

Notice of Reasons for Refusal issued Jul. 9, 2024 for Japanese Patent Application No. 2023-094581 (See English Translation).

* cited by examiner

LED TRANSFER METHOD AND MANUFACTURING METHOD OF DISPLAY DEVICE USING THE SAME

CROSS-REFERENCE TO RELATED APPLICATIONS

This application claims the benefit of and priority to Korean Patent Application No. 10-2020-0166705 filed on Dec. 2, 2020, in the Republic of Korea, the entire contents of which are hereby expressly incorporated by reference into the present application.

BACKGROUND

Technical Field

The present disclosure relates to a light emitting diode (LED) transfer method and a manufacturing method of a display device using the same, and more particularly, to an LED transfer method with improved yield when transferring a plurality of LEDs and a manufacturing method of a display device using the same.

Description of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide display area are being studied.

In recent years, display devices including light emitting diodes (LEDs) have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-brightness image.

SUMMARY

Accordingly, embodiments of the present disclosure are directed to a light emitting diode (LED) transfer method and a manufacturing method of a display device using the same that substantially obviate one or more of the problems due to limitations and disadvantages of the related art.

An aspect of the present disclosure is to provide a light emitting diode (LED) transfer method that reduces defects of a plurality of light emitting diodes during a transfer process of transferring the plurality of light emitting diodes from a wafer to a donor substrate, and a manufacturing method of a display device using the same.

Another aspect of the present disclosure is to provide an LED transfer method with improved alignment accuracy of a plurality of light emitting diodes, and a manufacturing method of a display device using the same.

Still another aspect of the present disclosure is to provide an LED transfer method in which a process time is reduced by increasing a detachment speed of a wafer and a donor substrate, and a manufacturing method of a display device using the same.

Still another aspect of the present disclosure is to provide an LED transfer method that minimizes distortion of a plurality of light emitting diodes when a wafer and a donor substrate or a donor substrate and a display panel are detached, and a manufacturing method of a display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting diode (LED) transfer method includes bonding a rigid substrate on which a plurality of light emitting diodes are formed and a flexible substrate, transferring the plurality of light emitting diodes to the flexible substrate, and detaching the rigid substrate and the flexible substrate, wherein the detaching of the rigid substrate and the flexible substrate includes separating the rigid substrate and the flexible substrate in a state in which one surface of the rigid substrate is fixed and a portion among outermost portions of the flexible substrate is fixed by a fixing member. Accordingly, it is possible to reduce transfer defects of the plurality of light emitting diodes by detaching the flexible substrate and the rigid substrate in a line-by-line separation method.

In another aspect, a manufacturing method of a display device includes bonding a wafer and a donor substrate, transferring a plurality of light emitting diodes of the wafer to the donor substrate, detaching the wafer and the donor substrate, bonding the donor substrate on which the plurality of light emitting diodes are disposed and a display panel, transferring the plurality of light emitting diodes of the donor substrate to the display panel, and detaching the display panel and the donor substrate, wherein the detaching of the wafer and the donor substrate includes detaching the wafer and the donor substrate in a state in which one surface of the wafer is fixed to a head and a portion among outermost portions of the donor substrate is fixed to a stage. Therefore, the wafer and the donor substrate can be separated in a line-by-line separation method by detaching the wafer and the donor substrate in a state in which only a portion among outermost portions of the donor substrate is fixed, and an impact that is applied to the plurality of light emitting diodes on the donor substrate can be minimized.

Other detailed matters of the exemplary embodiments are included in the detailed description and the drawings.

According to the present disclosure, when a donor substrate is detached from a wafer, only one end of the donor substrate is physically fixed, thereby minimizing distortion of a plurality of light emitting diodes on the donor substrate.

According to the present disclosure, a decrease in transfer yield of a plurality of light emitting diodes can be minimized by separating a donor substrate and a wafer line-by-line.

According to the present disclosure, it is possible to reduce process time and costs and improve productivity by improving a transfer speed of light emitting diodes.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are

DETAILED DESCRIPTION

Figure 1:
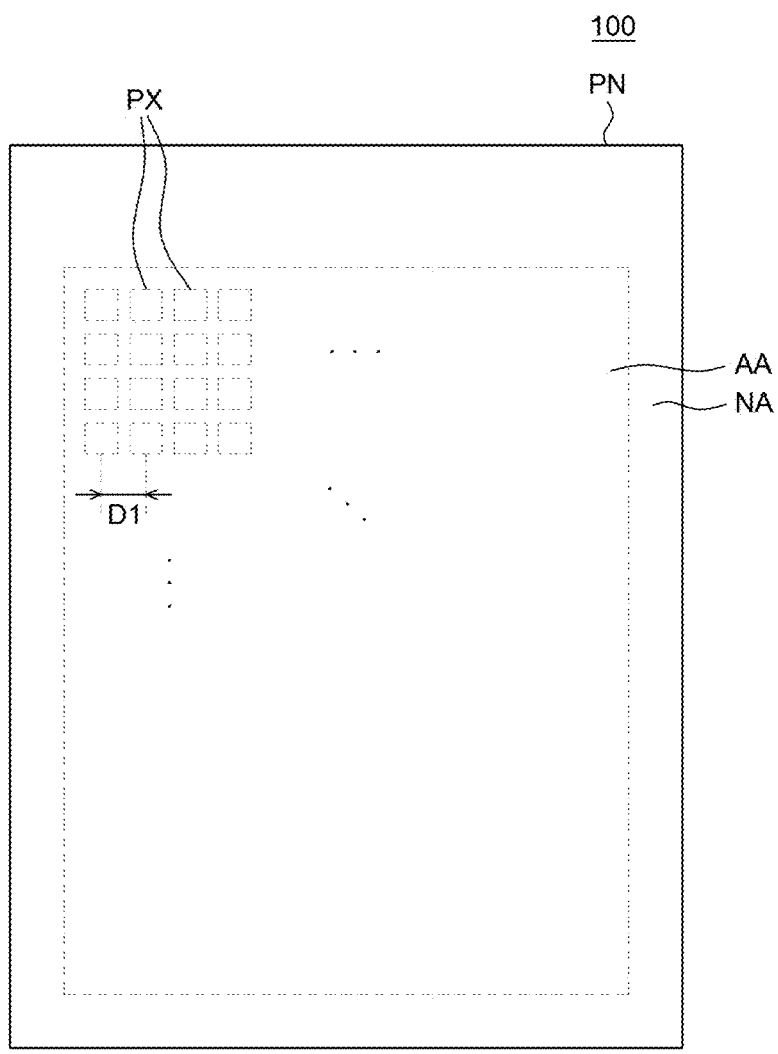
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, LED transfer method and manufacturing method of display device using the same according to exemplary embodiments of the present disclosure will be described in detail with reference to accompanying drawings.

FIG. 1 is a plan view of a display device according to an exemplary embodiment of the present disclosure. In FIG. 1, only a display panel PN and a plurality of pixels PX among various components of a display device 100 are illustrated for convenience of explanation.

The display panel PN is a component to display an image and includes a display area AA and a non-display area NA.

The display panel PN includes the display area AA and the non-display area NA.

The display area AA is an area for displaying an image. The plurality of pixels PX for displaying an image and a circuit unit for driving the plurality of pixels PX may be disposed in the display area AA. The circuit unit may include various thin film transistors, capacitors, and lines for driving the pixels PX. For example, the circuit unit may include various components such as a driving thin film transistor, a switching thin film transistor, a storage capacitor, a gate line, and a data line, but is not limited thereto The non-display area NA is an area in which an image is not displayed, and is an area in which various lines, driver ICs, and the like for driving the pixels PX disposed in the display area AA are disposed. For example, various driver ICs such as a gate driver IC and a data driver IC may be disposed in the non-display area NA.

Although it is illustrated that the non-display area NA surrounds the display area AA in FIG. 1, the non-display area NA may be an area extending from one side of the display area AA, but is not limited thereto.

The plurality of pixels PX are disposed in the display area AA of the display panel PN. Each of the plurality of pixels PX may include a plurality of sub-pixels. The plurality of sub-pixels are individual units that emit light, and a light emitting diode (LED) and a driving circuit are formed in each of the plurality of sub-pixels. For example, the plurality of pixels PX may include a red sub-pixel, a green sub-pixel, and a blue sub-pixel, but are not limited thereto, and the plurality of pixels PX may further include a white sub-pixel.

The light emitting diodes disposed in the plurality of respective sub-pixels may be light emitting diodes that emit light of the same color or light emitting diodes that emit light of different colors. For example, when the plurality of respective light emitting diodes emit light of different colors, one portion of the plurality of light emitting diodes may be red light emitting diodes that emit red light, another portion of the plurality of light emitting diodes may be green light emitting diodes that emit green light, a reminder of the plurality of light emitting diodes may be blue light emitting diodes that emit blue light. In addition, a combination of light from the red light emitting diode, the green light emitting diode, and the blue light emitting diode can realize light of various colors including white.

And, when the plurality of light emitting diodes emit light of the same color, a light conversion member may be disposed together with the plurality of light emitting diodes. For example, when the plurality of light emitting diodes are blue light emitting diodes, a red light conversion layer and a green light conversion layer may be disposed together in each of the plurality of sub-pixels. However, types and the number of light emitting diodes disposed in the plurality of sub-pixels constituting the pixels PX may be variously configured according to embodiments, but are not limited thereto.

The plurality of pixels PX may be disposed at equal distances. The plurality of pixels PX may be disposed at the same distance. For example, a distance from a center of one pixel PX to a center of another pixel PX adjacent thereto among the plurality of pixels PX may be a first distance D1. In addition, the first distance D1, that is a distance between the pixels PX, may also be defined as a pixel pitch.

Figure 2:
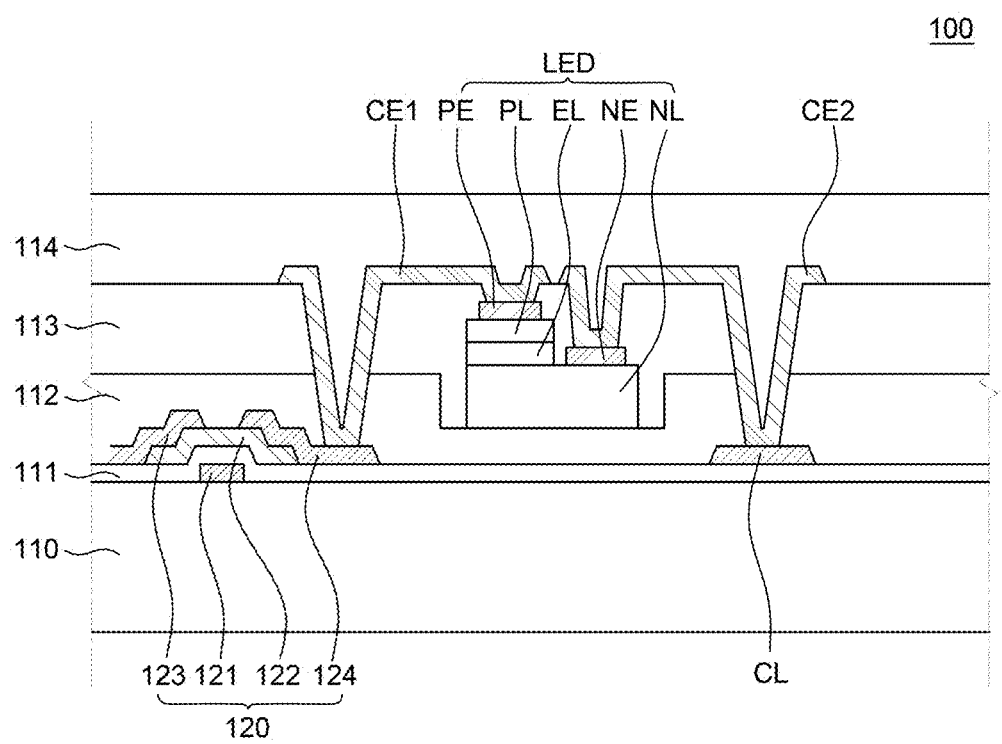
FIG. 2 is a schematic cross-sectional view of sub-pixels constituting a plurality of pixels of the display device according to an exemplary embodiment of the present disclosure.

Hereinafter, FIG. 2 is referred for a more detailed description of the plurality of pixels PX.

FIG. 2 is a schematic cross-sectional view of sub-pixels constituting a plurality of pixels of the display device according to an exemplary embodiment of the present disclosure.

Referring to FIG. 2, a substrate 110 is a support member for supporting other components of the display device 100, and may be formed of an insulating material. For example, the substrate 110 may be formed of glass or resin. In addition, the substrate 110 may be formed of a polymer or plastic such as polyimide (PI), or may be formed of a material having flexibility.

A driving transistor 120 is disposed on the substrate 110 of the display panel PN. The driving transistor 120 may be used as a driving element of the display device 100. The driving transistor 120 includes a gate electrode 121, an active layer 122, a source electrode 123, and a drain electrode 124.

The gate electrode 121 is disposed on the substrate 110. The gate electrode 121 may be formed of a conductive material, for example, copper (Cu), aluminum (Al), molybdenum (Mo), titanium (Ti), or an alloy thereof, but is not limited thereto.

A gate insulating layer 111 is disposed on the gate electrode 121. The gate insulating layer 111 is a layer for insulating the gate electrode 121 and the active layer 122 and may be formed of an insulating material. For example, the gate insulating layer 111 may be formed of a single layer or multilayers of silicon oxide (SiOx) or silicon nitride (SiNx), but is not limited thereto.

The active layer 122 is disposed on the gate insulating layer 111. For example, the active layer 122 may be formed of an oxide semiconductor, amorphous silicon, polysilicon, or the like, but is not limited thereto.

The source electrode 123 and the drain electrode 124 are disposed on the active layer 122 to be spaced apart from each other. The source electrode 123 and the drain electrode 124 may be electrically connected to the active layer 122. The source electrode 123 and the drain electrode 124 may be formed of a conductive material, for example, copper (Cu), aluminum (Al), molybdenum (Mo), titanium (Ti), or an alloy thereof, but are not limited thereto.

Meanwhile, in the present disclosure, the driving transistor 120 is illustrated as the driving transistor 120 having a structure in which the gate electrode 121 is disposed at a bottom, the active layer 122 is disposed on the gate electrode 121, and the source electrode 123 and the drain electrode 124 are disposed on the active layer 122, but the present disclosure is not limited thereto.

A common line CL is disposed on the gate insulating layer 111. The common line CL may transmit a common power supplied from the outside to a plurality of light emitting diodes LED of the plurality of sub-pixels. The common line CL may be formed of, for example, the same material as the source electrode 123 and the drain electrode 124 of the driving transistor 120 and may be formed in the same process, but a material and arrangement of the common line CL are not limited thereto.

A first insulating layer 112 is disposed on the driving transistor 120 and the common line CL. The first insulating layer 112 may be disposed over the driving transistor 120 to protect the driving transistor 120. The first insulating layer 112 may be formed of an organic material such as benzocyclobutene or photo acryl.

The light emitting diode LED is disposed on the first insulating layer 112. The light emitting diode LED may be an LED or a micro-LED formed of an inorganic material. The light emitting diode LED may be electrically connected to the source electrode 123 or the drain electrode 124 of the driving transistor 120 through a contact hole formed in the first insulating layer 112. Meanwhile, although FIG. 2 illustrates that the light emitting diode LED is disposed on the first insulating layer 112 which is patterned, the light emitting diode LED may be disposed on the first insulating layer 112 which is not patterned and has a flat upper surface, but is not limited thereto.

When the plurality of light emitting diodes LED are LEDs, they may be formed in various structures such as a lateral type, a vertical type, and a flip chip type. The lateral type LED includes an n-electrode NE and a p-electrode PE that are horizontally disposed on both sides of a light emitting layer EL. The vertical type LED includes an n-electrode NE and a p-electrode PE that are disposed above and below the light emitting layer EL. The flip chip type LED has substantially the same structure as the lateral type LED, and the flip chip type LED has a structure in which the n-electrode NE and the p-electrode PE are horizontally disposed below the light emitting layer EL, whereas the lateral type LED has a structure in which the n-electrode NE and the p-electrode PE are horizontally disposed above the light emitting layer EL. Hereinafter, it is described assuming that the plurality of light emitting diodes LED are LEDs having a lateral structure, but types of the plurality of light emitting diodes LED are not limited thereto.

Meanwhile, the light emitting diodes LED may be manufactured by a process separate from a thin film transistor (TFT) array process of the display panel PN. For example, the plurality of light emitting diodes LED may be formed on a wafer formed of a material such as sapphire and then, the plurality of light emitting diodes LED may be transferred to the display panel PN on which the driving transistor 120 and various lines are disposed.

The light emitting diode LED includes a p-type semiconductor layer PL, a light emitting layer EL, an n-type semiconductor layer NL, a p-electrode PE, and an n-electrode NE.

The n-type semiconductor layer NL is disposed on the first insulating layer 112, and the p-type semiconductor layer PL is disposed on the n-type semiconductor layer NL. Each of the p-type semiconductor layer PL and the n-type semiconductor layer NL may be a layer formed by implanting n-type or p-type impurities into gallium nitride (GaN). For example, the p-type semiconductor layer PL may be a layer formed by implanting p-type impurities into gallium nitride, and the n-type semiconductor layer NL may be a layer formed by implanting n-type impurities into gallium nitride, but they are not limited thereto. The p-type impurity may be magnesium (Mg), zinc (Zn), beryllium (Be) or the like, and the n-type impurity may be silicon (Si), germanium (Ge), tin (Sn) or the like, but they are not limited thereto.

The light emitting layer EL is disposed between the p-type semiconductor layer PL and the n-type semiconductor layer NL. The light emitting layer EL may emit light by receiving holes and electrons from the p-type semiconductor layer PL and the n-type semiconductor layer NL. The light emitting layer EL may have a single layer or multi-quantum well (MQW) structure, for example, the light emitting layer EL may be formed of indium gallium nitride (InGaN) or gallium nitride (GaN), but is not limited thereto.

The p-electrode PE is disposed on the p-type semiconductor layer PL, and the n-electrode NE is disposed on the n-type semiconductor layer NL. The p-electrode PE may be electrically connected to the p-type semiconductor layer PL, and the n-electrode NE may be electrically connected to the n-type semiconductor layer NL.

A second insulating layer 113 is disposed on the light emitting diode LED and the first insulating layer 112. The second insulating layer 113 may be disposed on the plurality of light emitting diodes LED to protect the plurality of light emitting diodes LED. The second insulating layer 113 may be formed of an organic material such as benzocyclobutene or photo acryl.

A first connection electrode CE1 and a second connection electrode CE2 are disposed on the second insulating layer 113. The first connection electrode CE1 may electrically connect the driving transistor 120 and the light emitting diode LED through a contact hole in the first insulating layer 112 and the second insulating layer 113. For example, the first connection electrode CE1 may electrically connect the drain electrode 124 of the driving transistor 120 and the p-electrode PE of the light emitting diode LED. The first connection electrode CE1 may be formed of a transparent metal oxide such as indium tin oxide (ITO), indium gallium zinc oxide (IGZO), or indium gallium oxide (IGO), but is not limited thereto.

The second connection electrode CE2 may electrically connect the common line CL and the light emitting diode LED through a contact hole in the first insulating layer 112 and the second insulating layer 113. For example, the second connection electrode CE2 may electrically connect the common line CL and the n-electrode NE of the light emitting diode LED. The second connection electrode CE2 may be formed of a transparent metal oxide such as indium tin oxide (ITO), indium gallium zinc oxide (IGZO), or indium gallium oxide (IGO), but is not limited thereto.

A protective layer 114 is disposed on the first connection electrode CE1 and the second connection electrode CE2. The protective layer 114 may be disposed on an entire surface of the display panel PN to protect the plurality of light emitting diodes LED and a circuit including the driving transistor 120 from external impacts. The protective layer 114 may be formed of, for example, optical clear adhesive (OCA) or optical clear resin (OCR), but is not limited thereto.

Meanwhile, although not shown in the drawings, a reflective layer disposed to overlap the plurality of light emitting diodes LED may be further disposed. The reflective layer is disposed to overlap the plurality of light emitting diodes LED and may reflect light emitted from the plurality of light emitting diodes LED to the outside of the display device 100 and improve luminous efficiency of the display device 100.

Hereinafter, an LED transfer method and a manufacturing method of the display device 100 using the same according to an exemplary embodiment of the present disclosure will be described with reference to FIG. 3 to FIG. 4G.

Figure 3:
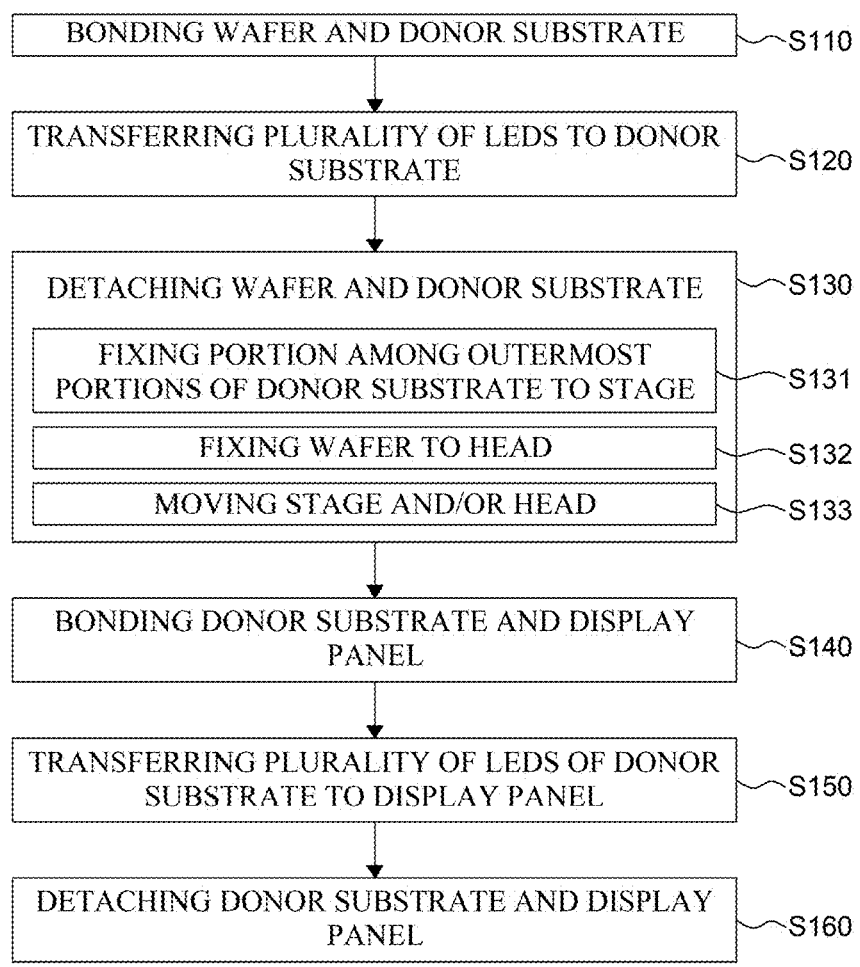
FIG. 3 is a process flowchart illustrating a manufacturing method of the display device according to an exemplary embodiment of the present disclosure.
Figure 4A:
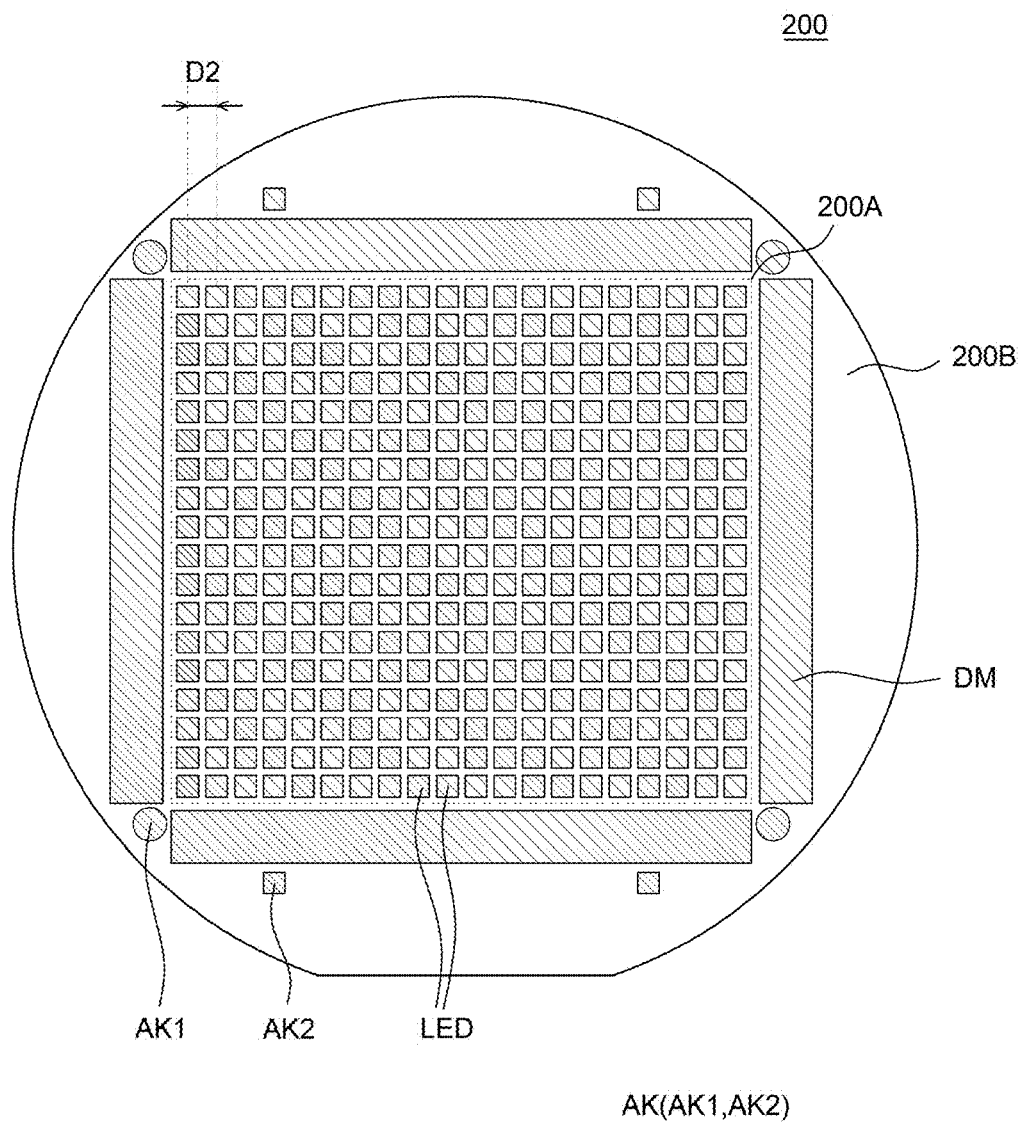
FIG. 4A to FIG. 4G are schematic process diagrams for explaining an LED transfer method and a manufacturing method of a display device using the same according to an exemplary embodiment of the present disclosure.
Figure 4B:
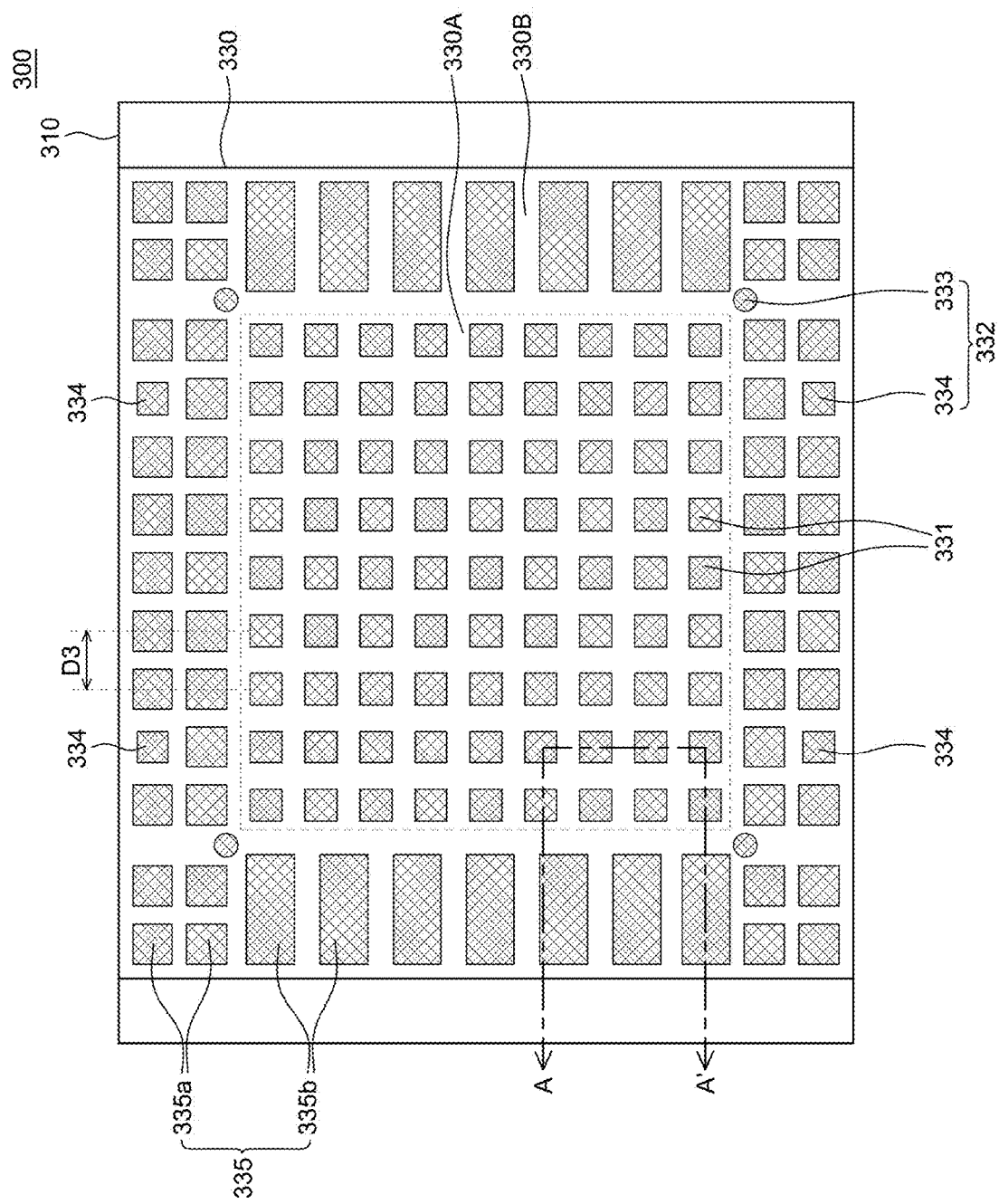
Figure 4C:
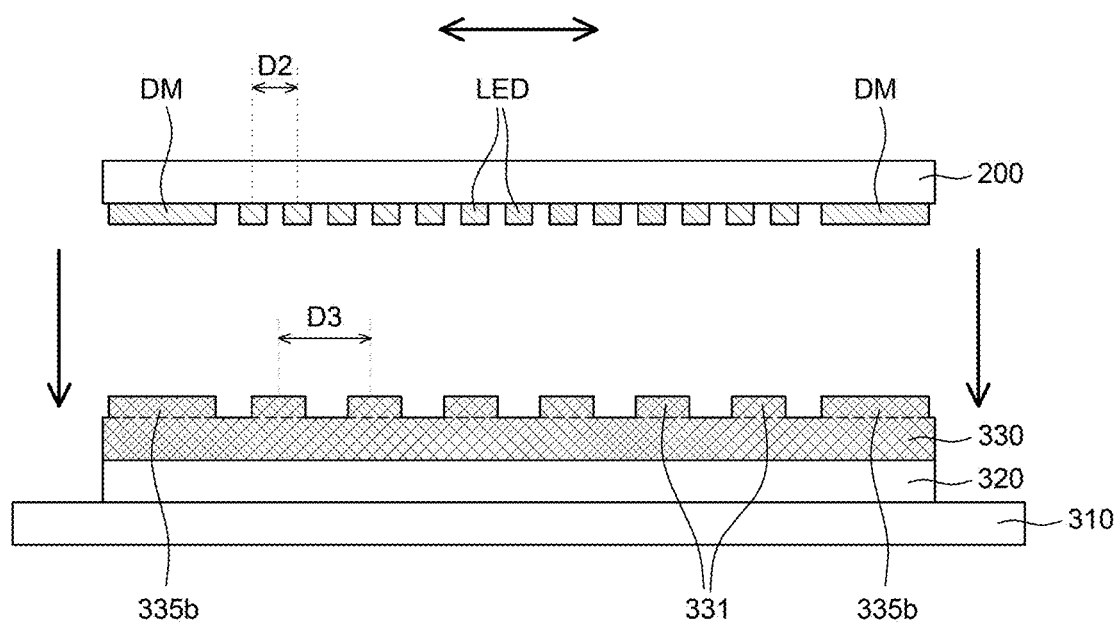
Figure 4D:
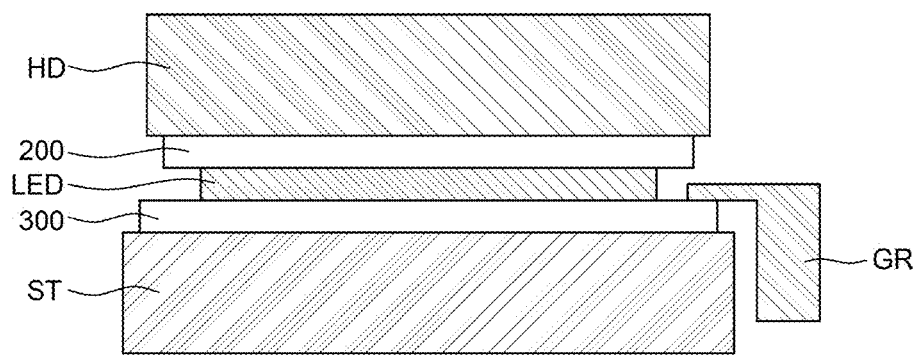
Figure 4E:
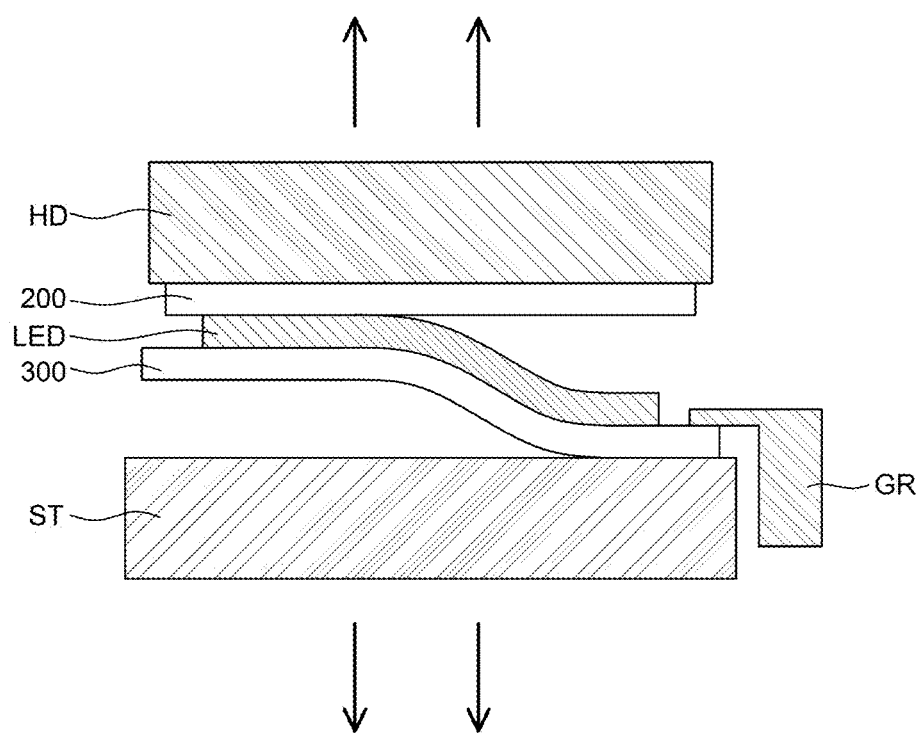
Figure 4F:
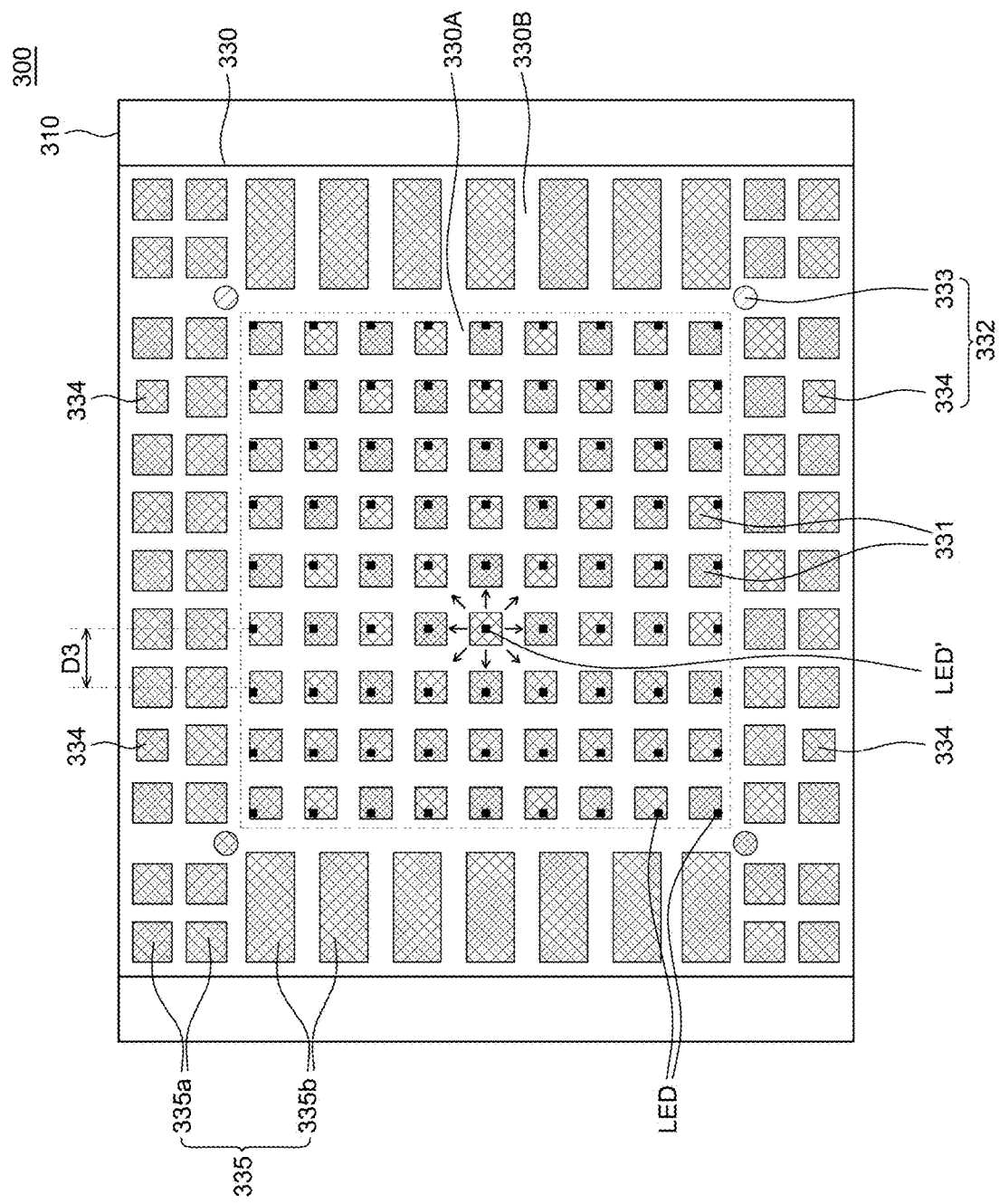

FIG. 3 is a process flowchart illustrating a manufacturing method of the display device according to an exemplary embodiment of the present disclosure. FIG. 4A to FIG. 4G are schematic process diagrams for explaining an LED transfer method and a manufacturing method of a display device using the same according to an exemplary embodiment of the present disclosure. Specifically, FIG. 4A to FIG. 4F are schematic process diagrams for explaining a primary transfer process, and FIG. 4G is a schematic process diagram for explaining a secondary transfer process. FIG. 4A is a plan view of the wafer 200, and FIG. 4B is a plan view of a donor substrate 300. FIG. 4C is a cross-sectional view taken along line A-A' of FIG. 4B. FIGS. 4D and 4E are schematic cross-sectional views for explaining a detachment process of the wafer 200 and the donor substrate 300 and schematically illustrate the donor substrate 300, the wafer 200, and the plurality of light emitting diodes LED, for convenience of explanation. FIG. 4F is a plan view of the donor substrate 300 after the primary transfer process is completed. FIG. 4G is a cross-sectional view of the donor substrate 300 and the display panel PN for explaining the secondary transfer process.

First, referring to FIG. 3, a primary transfer process is performed, so the plurality of light emitting diodes LED on the wafer 200 may be transferred to the donor substrate 300. After the primary transfer process is completed, a secondary transfer process is performed, so the plurality of light emitting diodes LED on the donor substrate 300 may be transferred to the display panel PN. Accordingly, a manufacturing process of the display device 100 may be completed by transferring the plurality of light emitting diodes LED from the wafer 200 to the donor substrate 300 and from the donor substrate 300 to the display panel PN.

Hereinafter, the primary transfer process will be described with reference to FIG. 3 and FIGS. 4A to 4F first.

Referring to FIG. 3 and FIG. 4A together, the wafer 200 is a substrate on which the plurality of light emitting diodes LED are formed. A material such as gallium nitride (GaN) or indium gallium nitride (InGaN) constituting the plurality of light emitting diodes LED is formed on the wafer 200 to grow a crystal layer, the crystal layer is cut into individual chips, and electrodes are formed thereon, whereby the plurality of light emitting diodes LED may be formed. The wafer 200 may be formed of sapphire, silicon carbide (SiC), gallium nitride (GaN), zinc oxide (ZnO), or the like, but is not limited thereto. Since the wafer 200 is formed of a hard material such as sapphire, it may be defined as a rigid substrate.

In this case, the plurality of light emitting diodes LED emitting light of the same color may be formed or the plurality of light emitting diodes LED emitting light of different colors may be formed on one wafer 200. Hereinafter, it is described assuming that the plurality of light emitting diodes LED emitting light of the same color are formed on one wafer 200.

The wafer 200 includes an active area 200A and an outer area 200B. The active area 200A is an area in which the plurality of light emitting diodes LED are formed, and the outer area 200B disposed outside the active area 200A is an area in which one or more dams DM and a plurality of alignment keys AK are disposed.

The plurality of light emitting diodes LED are disposed in the active area 200A. The plurality of light emitting diodes LED may be formed by forming an epitaxial layer on the wafer 200 and then, patterning it. Specifically, the plurality of light emitting diodes LED may be formed by growing materials forming the n-type semiconductor layer NL, the light emitting layer EL, and the p-type semiconductor layer PL that constitute the plurality of light emitting diodes LED on the wafer 200 and then, patterning them into plural numbers, that is, performing an isolation process.

The plurality of light emitting diodes LED may be disposed with a second distance D2. The second distance D2 may be a distance from the center of one light emitting diode LED to the center of another light emitting diode LED adjacent thereto among the plurality of light emitting diodes LED. In addition, the second distance D2 may be a distance smaller than the first distance D1, that is a distance between the plurality of pixels PX of the display panel PN.

The plurality of alignment keys AK disposed in the outer area 200B include first alignment keys AK1 and second alignment keys AK2. The first alignment keys AK1 and the second alignment keys AK2 may be disposed in the outer area 200B. However, the first alignment key AK1 and the second alignment key AK2 are not limited to those shown in the drawings, and the numbers and positions thereof may be variously designed.

The first alignment keys AK1 are components used to align the wafer 200 and the donor substrate 300. The first alignment keys AK1 are marks for matching alignment and parallelism with the donor substrate 300 when the plurality of light emitting diodes LED of the wafer 200 are transferred to the donor substrate 300. The wafer 200 and the donor substrate 300 may be aligned and parallelized by aligning the first alignment keys AK1 of the wafer 200 and alignment protrusions 332 of the donor substrate 300.

For example, the first alignment keys AK1 may be metallic patterns that are disposed between a plurality of the dams DM in the outer area 200B, or are formed on upper portions of the plurality of dams DM or lower portions of the plurality of dams DM. Accordingly, the wafer 200 and the donor substrate 300 may be aligned by detecting the first alignment keys AK1 through a vision method. In this case, even when the first alignment keys AK1 are formed on the dams DM, which will be described later, since the first alignment keys AK1 are a kind of metal patterns, a step that is generated between the wafer 200 and the donor substrate 300 by the first alignment keys AK1 may be insignificant. Accordingly, the first alignment keys AK1 may be formed without being limited to positions of the dams DM in the outer area 200B.

The second alignment keys AK2 are components used to align the donor substrate 300 and the display panel PN. The second alignment keys AK2 may be transferred to the donor substrate 300, together with the plurality of light emitting diodes LED when the plurality of light emitting diodes LED of the wafer 200 are transferred to the donor substrate 300. Then, by using the second alignment keys AK2 on the donor substrate 300, alignment and parallelism of the donor substrate 300 and the display panel PN may be matched.

The first alignment keys AK1 and the second alignment keys AK2 may be formed together when the plurality of light emitting diodes LED are formed, or may be formed through a process separate from that of the plurality of light emitting diodes LED. If the first alignment keys AK1 and the second alignment keys AK2 are formed together with the plurality of light emitting diodes LED, the first alignment keys AK1 and the second alignment keys AK2 may be formed of the same material as at least a portion of the materials constituting the plurality of light emitting diodes LED. However, materials and forming processes of the first alignment keys AK1 and the second alignment keys AK2 may be variously configured according to design, but are not limited thereto.

The first alignment key AK1 and the second alignment key AK2 may be variously configured in shape and size. In order to identify the first alignment key AK1 and the second alignment key AK2 disposed in the outer area 200B, shapes or sizes of the first alignment key AK1 and the second alignment key AK2 may be configured differently. For example, the size of the first alignment key AK1 may be greater than the size of the second alignment key AK2, but the present disclosure is not limited thereto.

One or more dams DM are disposed in the outer area 200B. The dams DM are components to improve adhesion to the donor substrate 300 by improving a contact area with the donor substrate 300, which will be described later. The one or more dams DM may be formed together with the plurality of light emitting diodes LED. Specifically, the one or more dams DM may be formed by leaving some of an epitaxial layer overlapping the outer area 200B without performing patterning in a process of patterning the epitaxial layer into plural numbers. Therefore, a height of the dams DM may be substantially equal to a height of the plurality of light emitting diodes LED.

Meanwhile, a minimum width of the dams DM may be designed in consideration of a distance by which the wafer 200 and the donor substrate 300 are shifted the most and a width of an area in which a plurality of dam protrusions 335 of the donor substrate 300 are disposed. In a selective transfer method in which only some light emitting diodes LED among the plurality of light emitting diodes LED on the wafer 200 are transferred to the donor substrate 300, a bonding position of the donor substrate 300 and the wafer 200 may be slightly varied. For example, a bonding position of the donor substrate 300 and the wafer 200 may vary within a third distance D3 that is a distance between a plurality of chip protrusions 331 of the donor substrate 300, which will be described later. At this time, at least a portion of the dams DM may contact the plurality of dam protrusions 335 in a non-transfer area 330B of the donor substrate 300, which will be described later, in order to improve adhesion between the donor substrate 300 and the wafer 200. In this case, in order to bring at least a portion of the dams DM into contact with the plurality of dam protrusions 335, the minimum width of the dams DM may be configured to be equal to or greater than a distance by which the donor substrate 300 and the wafer 200 are shifted the most, for example, a third distance D3. If the minimum width of the dams DM is less than or equal to the third distance D3, at least a portion of the dams DM may be difficult to be adhered to the non-transfer area 330B of the donor substrate 300, and adhesion between the donor substrate 300 the wafer 200 may be reduced. Accordingly, by configuring the minimum width of the dams DM to be equal to or greater than the distance by which the wafer 200 and the donor substrate 300 are shifted the most, a certain level or more of adhesion between the wafer 200 and the donor substrate 300 during a transfer process may be secured.

Distances between the dams DM in the outer area 200B and the light emitting diodes LED disposed at outermost portions in the active area 200A may be equal to or greater than a distance from an outer portion of one light emitting diode LED to an outer portion of another light emitting diode LED adjacent to the one light emitting diode LED. In this case, the distance from the outer portion of one light emitting diode LED to the outer portion of another light emitting diode LED adjacent thereto may be smaller than the second distance D2. The distances between the dams DM in the outer area 200B and the light emitting diodes LED disposed at the outermost portions in the active area 200A are formed to be equal to or greater than the distance from the outer portion of one light emitting diode LED to the outer portion of another light emitting diode LED adjacent thereto, so that interference between the light emitting diodes LED during the transfer process can be minimized, which will be described later with reference to FIG. 4E.

Meanwhile, although FIG. 4A illustrates that the dams DM are disposed adjacent to respective four sides of the active area 200A, the dams DM may be formed to extend to edges of the wafer 200 or the dams DM may be formed in an entirety of the outer area 200B except for a portion where structures such as the plurality of alignment keys AK are formed and may be integrally formed. However, the present disclosure is not limited thereto.

Meanwhile, the dams DM may be disposed between the active area 200A and the second alignment keys AK2. The second alignment keys AK2 may be disposed outside the dams DM in the outer area 200B. When the second alignment keys AK2 are formed by the same process as that of the plurality of light emitting diodes LED, the second alignment keys AK2 may also be patterned together with the epitaxial layer at the time of patterning the epitaxial layer for forming the plurality of light emitting diodes LED. That is, the second alignment keys AK2 may be formed by patterning the epitaxial layer formed in the outer area 200B. In this case, after sufficiently securing areas in which the dams DM are formed, the second alignment keys AK2 may be formed outside the dams DM. Therefore, the second alignment keys AK2 may be disposed to be spaced apart from the active area 200A by a distance equal to or greater than the minimum width of the dams DM, for example, the third distance D3.

Referring to FIG. 4B, the donor substrate 300 includes a base layer 310, an adhesive layer 320, a resin layer 330, the plurality of chip protrusions 331, the plurality of alignment protrusions 332, and the plurality of dam protrusions 335.

The base layer 310 is a component to support various components included in the donor substrate 300, and may be formed of at least a rigid material than the resin layer 330 in order to minimize bending of the resin layer 330. The base layer 310 may be disposed under the resin layer 330 and support the resin layer 330, the plurality of chip protrusions 331, and the plurality of alignment protrusions 332. For example, the base layer 310 may include a polymer or plastic, and may be formed of poly carbonate (PC) or poly ethylene terephthalate (PET) but the present disclosure is not limited thereto.

The resin layer 330 is disposed on the base layer 310. The resin layer 330 may support the plurality of chip protrusions 331 to which the plurality of light emitting diodes LED are attached during the transfer process. The resin layer 330 may be formed of a polymer resin having viscoelasticity. For example, the resin layer 330 may be composed of poly dimethyl siloxane (PDMS), poly urethane acrylate (PUA), poly ethylene glycol (PEG), polymethyl methacrylate (PMMA), poly styrene (PS), epoxy resin, urethane resin, acrylic resin or the like, but is not limited thereto.

The resin layer 330 includes a transfer area 330A and the non-transfer area 330B. The transfer area 330A is an area in which the plurality of chip protrusions 331 are disposed. The transfer area 330A is an area where the plurality of chip protrusions 331 to which the plurality of light emitting diodes LED are attached are disposed, and may be disposed to overlap at least a portion of the wafer 200 or the display panel PN during the transfer process.

The non-transfer area 330B is an area in which the plurality of alignment protrusions 332 and the plurality of dam protrusions 335 are disposed. The second alignment keys AK2 of the wafer 200 may be transferred to the non-transfer area 330B.

The plurality of chip protrusions 331 are protrusions on which the plurality of light emitting diodes LED are disposed, and may be formed to extend from one surface of the resin layer 330. The plurality of chip protrusions 331 may be formed integrally with the resin layer 330, and may be formed of a polymer material having viscoelasticity in the same manner as the resin layer 330. For example, the plurality of chip protrusions 331 may be formed of poly dimethyl siloxane (PDMS), poly urethane acrylate (PUA), poly ethylene glycol (PEG), polymethyl methacrylate (PMMA), poly styrene (PS), epoxy resin, urethane resin, acrylic resin or the like, but is not limited thereto.

The plurality of light emitting diodes LED may be temporarily attached to upper surfaces of the plurality of chip protrusions 331. The plurality of light emitting diodes LED formed on the wafer 200 may be transferred to the upper surfaces of the plurality of chip protrusions 331, and may temporarily maintain a state thereof in which the plurality of light emitting diodes LED are attached onto the upper surfaces of the plurality of chip protrusions 331 until they are transferred to the display panel PN. The donor substrate 300 including the resin layer 330 which is formed of a flexible material and the plurality of chip protrusions 331 which are integrally formed with the resin layer 330 and onto which the plurality of light emitting diodes LED are temporarily attached can be defined as a flexible substrate.

In this case, the plurality of chip protrusions 331 may be disposed with the third distance D3. The third distance D3 may be greater than the second distance D2, which is a distance between the plurality of light emitting diodes LED of the wafer 200. The third distance D3 of the plurality of chip protrusions 331 may be N times the second distance D2 of the plurality of light emitting diodes LED of the wafer 200. In this case, only some light emitting diodes LED among the plurality of light emitting diodes LED that are disposed with the second distance D2 on the wafer 200 may be transferred onto the plurality of chip protrusions 331 of the donor substrate 300. For example, when the third distance D3 is twice the second distance D2, odd-numbered light emitting diodes LED or even-numbered light emitting diodes LED in one line can be selectively transferred onto the plurality of chip protrusions 331.

In addition, the third distance D3 may be a distance N times or 1/N times the first distance D1 that is a distance between the plurality of pixels PX of the display panel PN, that is, the pixel pitch. Specifically, the third distance D3 from a center of one chip protrusion 331 to a center of another chip protrusion 331 adjacent thereto may be N times or 1/N times the pixel pitch. The distance between the plurality of chip protrusions 331 is formed to be N times or 1/N times the pixel pitch, and the pixel pitch of the display panel PN is varied so that the plurality of light emitting diodes LED can be transferred to one donor substrate 300. In consideration of the third distance D3 which is the distance between the plurality of chip protrusions 331 and the first distance D1 which is the pixel pitch, the plurality of light emitting diodes LED disposed on the plurality of chip protrusions 331 are selectively transferred, so that the pixel pitch may be varied. For example, when the pixel pitch is formed to be identical to the third distance D3 that is the distance between the plurality of chip protrusions 331, the plurality of light emitting diodes LED on the plurality of chip protrusions 331 can be transferred to the display panel PN at once. For example, when the pixel pitch is formed to be twice the third distance D3 of the plurality of chip protrusions 331, only the plurality of light emitting diodes LED on odd-numbered chip protrusions 331 or even-numbered chip protrusions 331 among the plurality of chip protrusions 331 disposed in the same row are transferred to thereby adjust the pixel pitch. However, the arrangement of the plurality of chip protrusions 331 and the distance therebetween may be variously changed according to design, but are not limited thereto.

Sizes of the plurality of chip protrusions 331 may be greater than sizes of the plurality of light emitting diodes LED. Since sizes of the upper surfaces of the plurality of chip protrusions 331 are formed to be greater than those of the plurality of light emitting diodes LED, even if an alignment error between the donor substrate 300 and the wafer 200 occurs, the plurality of light emitting diodes LED may be seated on the plurality of chip protrusions 331. Accordingly, in consideration of the alignment error between the wafer 200 and the donor substrate 300, the sizes of the upper surfaces of the plurality of chip protrusions 331 may be formed to be greater than those of the plurality of light emitting diodes LED.

The plurality of alignment protrusions 332 and the plurality of dam protrusions 335 are disposed in the non-transfer area 330B.

The plurality of alignment protrusions 332 include a plurality of first alignment protrusions 333 and a plurality of second alignment protrusions 334.

The plurality of first alignment protrusions 333 are components used to align the wafer 200 and the donor substrate 300. The plurality of first alignment protrusions 333 may be disposed to correspond to the first alignment keys AK1 of the wafer 200. For example, the alignment and parallelism of the wafer 200 and the donor substrate 300 may be matched by aligning the first alignment keys AK1 of the wafer 200 and the first alignment protrusions 333 of the donor substrate 300. In this case, the first alignment protrusion 333 and the first alignment key AK1 may have different shapes or sizes to facilitate identification thereof. For example, any one of the first alignment protrusion 333 and the first alignment key AK1 may have a donut shape with a hole in a middle thereof, and the other one may have a circular shape overlapping the hole. FIG. 4A and FIG. 4B illustrate that the first alignment key AK1 of the wafer 200 and the first alignment protrusion 333 of the donor substrate 300 have circular shapes, but shapes of the first alignment key AK1 and the first alignment protrusion 333 are not limited thereto.

The second alignment protrusions 334 may be disposed to correspond to the second alignment keys AK2 of the wafer 200. For example, two second alignment protrusions 334 may be provided in each of the non-transfer area 330B disposed above the transfer area 330A and the non-transfer area 330B disposed below the transfer area 330A. After aligning the wafer 200 and the donor substrate 300 by aligning the first alignment keys AK1 of the wafer 200 and the first alignment protrusions 333 of the donor substrate 300, the plurality of light emitting diodes LED of the wafer 200 may be transferred to the plurality of chip protrusions 331 of the donor substrate 300, and the second alignment keys AK2 of the wafer 200 may be transferred to the second alignment protrusions 334. In this case, the second alignment keys AK2 that are transferred to the donor substrate 300 may be used to align the display panel PN and the donor substrate 300.

The plurality of dam protrusions 335 include a plurality of first dam protrusions 335a and a plurality of second dam protrusions 335b. The plurality of dam protrusions 335 come in contact with the dams DM of the wafer 200 during the transfer process and may improve adhesion between the wafer 200 and the donor substrate 300 and at the same time, minimize deformation of the plurality of chip protrusions 331 from impacts applied to the donor substrate 300. For example, after bonding the wafer 200 and the donor substrate 300, when the plurality of light emitting diodes LED are transferred onto the donor substrate 300, an impact may be applied to the donor substrate 300 while the plurality of light emitting diodes LED move onto the donor substrate 300. When an impact is applied to the donor substrate 300, positions or shapes of the plurality of chip protrusions 331 of the transfer area 330A and the resin layer 330 may be deformed. At this time, the plurality of dam protrusions 335 of the non-transfer area 330B that is disposed to surround the transfer area 330A may maintain a bonding state with the wafer 200, and minimize deformation of the plurality of chip protrusions 331 of the transfer area 330A and the resin layer 330. In addition, the plurality of dam protrusions 335 may be in contact with the one or more dams DM of the wafer 200 to maintain a bonding state between the wafer 200 and the donor substrate 300.

In addition, one or more dam protrusions 335 may be disposed adjacent to the plurality of alignment protrusions 332. The one or more dam protrusions 335 may be disposed between the plurality of alignment protrusions 332 and the transfer area 330A or between the plurality of alignment protrusions 332 and an edge of the resin layer 330. The one or more dam protrusions 335 may be disposed adjacent to the plurality of alignment protrusions 332 to minimize separation of the donor substrate 300 and the wafer 200 due to degradation in adhesion between the donor substrate 300 and the wafer 200 in an area where the plurality of alignment protrusions 332 are disposed during the transfer process.

Sizes of plurality of dam protrusions 335 may be equal to or greater than those of the plurality of chip protrusions 331, and may have the same height as the plurality of chip protrusions 331. In addition, the plurality of dam protrusions 335 may be formed in various shapes when the sizes of the plurality of dam protrusions 335 are greater than those of the plurality of chip protrusions 331. For example, a plurality of first dam protrusions 335a that are disposed in the non-transfer area 330B above the transfer area 330A and in the non-transfer area 330B below the transfer area 330A among the plurality of dam protrusions 335 may have a square shape and be spaced apart from each other. For example, a plurality of second dam protrusions 335b that are disposed in the non-transfer area 330B on a left side of the transfer area 330A and in the non-transfer area 330B on a right side of the transfer area 330A among the plurality of dam protrusions 335 may have a rectangular shape. However, the shape of the plurality of dam protrusions 335 may be configured in various manners, but is not limited thereto.

In addition, a minimum width of the area in which the plurality of dam protrusions 335 are disposed may be identical to the minimum width of the dams DM. For example, the minimum width of the area in which the plurality of dam protrusions 335 are disposed may be configured to be equal to or greater than the third distance D3 which is the distance by which the wafer 200 and the donor substrate 300 are shifted the most. At this time, in the drawings, it is illustrated that the plurality of dam protrusions 335 are disposed in an entirety of the non-transfer area 330B, so that a width of the non-transfer area 330B in which the plurality of dam protrusions 335 are disposed corresponds to the minimum width of dams DM of the wafer 200. However, the plurality of dam protrusions 335 are disposed only in a part of the non-transfer area 330B, so that the width of the non-transfer area 330B and a size of the area where the plurality of dam protrusions 335 are disposed may be different from each other, but the present disclosure is not limited thereto.

And, by disposing the plurality of dam protrusions 335 that are spaced apart from each other in the non-transfer area 330B of the donor substrate 300, it is possible to reduce air trapping between the dams DM and the dam protrusions 335 when the wafer 200 and the donor substrate 300 are bonded to each other. This will be described later in detail with reference to FIG. 4C.

Meanwhile, in the donor substrate 300, the plurality of chip protrusions 331 may not be disposed, and the plurality of light emitting diodes LED may be directly transferred onto the resin layer 330. That is, the donor substrate 300 may not include separate chip protrusions 331. A structure of the donor substrate 300 may vary depending on a shape, an arrangement, and a transfer method of the plurality of light emitting diodes LED, but is not limited thereto. Hereinafter, for convenience of description, it is described assuming that the donor substrate 300 includes the plurality of chip protrusions 331, and the plurality of light emitting diodes LED are transferred to the plurality of chip protrusions 331, respectively.

The adhesive layer 320 is disposed between the resin layer 330 and the base layer 310. The adhesive layer 320 bonds the resin layer 330 and the base layer 310. The adhesive layer 320 may be formed of a material having an adhesive property, and may be formed of, for example, optical clear adhesive (OCA), pressure sensitive adhesive (PSA), or the like, but the present disclosure is not limited thereto.

However, the adhesive layer 320 may be omitted depending on design. For example, the resin layer 330 may be formed by directly coating a material constituting the resin layer 330 on the base layer 310 and then, curing it. In this case, since the resin layer 330 may be attached to the base layer 310 even if the adhesive layer 320 is not disposed, the adhesive layer 320 may be omitted depending on design, but is not limited thereto.

Next, referring to FIG. 4C together, the wafer 200 on which the plurality of light emitting diodes LED are formed and the donor substrate 300 are put into process equipment. Then, the wafer 200 and the donor substrate 300 put into the process equipment are aligned. In a state in which the wafer 200 and the donor substrate 300 are disposed such that the plurality of light emitting diodes LED on the wafer 200 and the plurality of chip protrusions 331 of the donor substrate 300 face each other, the wafer 200 and the donor substrate 300 may be aligned. For example, the wafer 200 and the donor substrate 300 may be aligned by aligning centers of the first alignment protrusions 333 of the donor substrate 300 and the first alignment keys AK1 of the wafer 200.

After the alignment of the wafer 200 and the donor substrate 300 is completed, the wafer 200 and the donor substrate 300 are bonded together in step S110. The wafer 200 and the donor substrate 300 may be bonded to each other so that the plurality of light emitting diodes LED in the active area 200A of the wafer 200 correspond to the plurality of chip protrusions 331 in the transfer area 330A of the donor substrate 300. The wafer 200 and the donor substrate 300 may be bonded to each other so that the dams DM in the outer region 200B of the wafer 200 correspond to the plurality of dam protrusions 335 in the non-transfer area 330B of the donor substrate 300.

In this case, the dams DM of the wafer 200 and the plurality of dam protrusions 335 of the donor substrate 300 are bonded to each other, so that a contact area between the wafer 200 and the donor substrate 300 may increase, and the wafer 200 and the donor substrate 300 may be uniformly bonded together. For example, the dams DM disposed to surround the active area 200A of the wafer 200 are bonded to the plurality of dam protrusions 335 of the donor substrate 300, so that an entirety of the wafer 200 and an entirety of the donor substrate 300 may be uniformly bonded to each other. If the dams DM are formed in only some of the four sides of the active area 200A in the wafer 200, a difference in adhesion occurs between an area in which the dams DM are formed and an area in which the dams DM are not formed, so it may be difficult to uniformly bond entire surfaces of the wafer 200 and the donor substrate 300. In this case, a bonding defect between the plurality of light emitting diodes LED of the wafer 200 and the plurality of chip protrusions 331 of the donor substrate 300 may occur. Accordingly, by forming the plurality of dams DM in the entirety of the outer area 200B of the wafer 200, the adhesion between the wafer 200 and the donor substrate 300 may be uniformly improved and the bonding defect between the plurality of light emitting diodes LED and the plurality of chip protrusions 331 may be reduced.

In addition, the plurality of dam protrusions 335 spaced apart from each other are disposed in the non-transferred area 330B of the donor substrate 300 corresponding to the outer area 200B of the wafer 200, so that air trapping may be minimized. Specifically, the dams DM having a size relatively greater than that of the plurality of dam protrusions 335 may be disposed in the outer area 200B of the wafer 200. When the dam protrusion 335 is formed to have a size corresponding to that of the dam DM, even if adhesion between the wafer 200 and the donor substrate 300 increases due to an increase in a contact area between the dam DM and the dam protrusion 335, a non-bonded area due to air trapping by the dam DM and the dam protrusion 335 may be generated. Accordingly, the plurality of the dam protrusions 335 corresponding to the dams DM are formed to be spaced apart from each other, so that the air may move to the outside of the wafer 200 and the donor substrate 300 through an empty space between the plurality of dam protrusions 335. At this time, the dam protrusions 335 disposed above or below the transfer area 330A may form an air passage extending in a column direction, and the dam protrusions 335 disposed on a left side or a right side of the transfer area 330A may form an air passage extending in a row direction. Accordingly, by disposing the plurality of dam protrusions 335 spaced apart from each other in the non-transfer area 330B of the donor substrate 300, a path through which air moves when the wafer 200 and the donor substrate 300 are bonded may be formed, and an area where the wafer 200 and the donor substrate 300 are not bonded due to air trapping may be reduced.

Next, the plurality of light emitting diodes LED of the wafer 200 are transferred to the donor substrate 300 in step S120. In a state in which the wafer 200 and the donor substrate 300 are disposed to face each other, laser may be selectively irradiated only to the light emitting diodes LED that are to be transferred to the donor substrate 300 among the plurality of light emitting diodes LED. The light emitting diodes LED irradiated with the laser may be detached from the wafer 200 and adhered to the plurality of chip protrusions 331 of the donor substrate 300.

Depending on design, the plurality of light emitting diodes LED may be transferred to only some of the plurality of chip protrusions 331 of the donor substrate 300, and the plurality of light emitting diodes LED may be transferred to the entirety of the plurality of chip protrusions 331. For example, when red light emitting diodes LED, green light emitting diodes LED, and blue light emitting diodes LED from different wafers 200 are transferred onto one donor substrate 300, the light emitting diodes LED from one wafer 200 may be transferred only to some chip protrusions 331 among the plurality of chip protrusions 331. For example, when only one type of light emitting diodes LED are transferred onto one donor substrate 300, so only one type of the light emitting diodes LED are transferred to the display panel PN, the light emitting diodes LED from one wafer 200 may be transferred to the entirety of the plurality of chip protrusions 331. However, in consideration of the third distance D3 that is the distance between the plurality of chip protrusions 331 and the first distance D1 that is the distance between the plurality of pixels PX of the display panel PN, types of the light emitting diodes LED that are transferred during the transfer process, and the number and positions of the chip protrusions 331 to which the light emitting diodes LED are transferred may be variously designed, but are not limited thereto.

Meanwhile, at least some second alignment keys AK2 among the plurality of second alignment keys AK2 of the wafer 200 may also be transferred to the donor substrate 300. In the state in which the wafer 200 and the donor substrate 300 are disposed to face each other, laser may be selectively irradiated onto only some second alignment keys AK2 that are to be transferred to the donor substrate 300 among the plurality of second alignment keys AK2. In addition, the second alignment keys AK2 irradiated with the laser may be detached from the wafer 200 and adhered to the second alignment protrusions 334 of the donor substrate 300.

In this case, if the plurality of second alignment keys AK2 are disposed to be deviated from their original positions on the plurality of second alignment protrusions 334, the plurality of light emitting diodes LED that maintain a constant distance with the plurality of second alignment keys AK2 may also be disposed to be deviated from their original positions on the plurality of chip protrusions 331. Accordingly, the positions of the plurality of light emitting diodes LED can be easily identified through the second alignment keys AK2. However, the second alignment keys AK2 may not be transferred together with the plurality of light emitting diodes LED, but the present disclosure is not limited thereto.

Next, referring to FIGS. 4D and 4E, after the plurality of light emitting diodes LED of the wafer 200 are transferred to the donor substrate 300, the wafer 200 and the donor substrate 300 are detached from each other in step S130.

Referring to FIG. 4D, the wafer 200 and the donor substrate 300 in the bonding state may be loaded on a stage ST. The wafer 200 and the donor substrate 300 in the bonding state may be positioned between the stage ST and a head HD. The wafer 200 may be disposed to correspond to the head HD, and the donor substrate 300 may be disposed to correspond to the stage ST.

However, in the present disclosure, it has been described that the wafer 200 and the donor substrate 300 are moved to the stage ST for the detachment process of the wafer 200 and the donor substrate 300, but bonding and detachment processes of the wafer 200 and the donor substrate 300 may be performed in the same stage, but are not limited thereto.

Then, a portion among outermost portions of the donor substrate 300 is physically fixed to the stage ST in step S131. One edge among a plurality of edges of the donor substrate 300 or at least one corner among four corners of the donor substrate 300 may be fixed to the stage ST using a fixing member GR. In addition, a remaining portion of the donor substrate 300 that is not fixed to the stage ST by the fixing member GR may be movable on the stage ST. For example, one edge among the outermost portions of the donor substrate 300 may be fixed to the stage ST by a gripper. For example, two adjacent corner portions among the outermost portions of the donor substrate 300 may be fixed to the stage ST by a gripper. The stage ST may not vacuum-adsorb the donor substrate 300, and the stage ST and the donor substrate 300 may be physically fixed by the fixing member GR.

Then, the wafer 200 is fixed to the head HD in step S132. One surface of the wafer 200 may be fixed to the head HD. For example, an entirety of one surface of the wafer 200 may be fixed to the head HD by a vacuum adsorption method or may be fixed to the head HD by a fixing member. In this case, the head HD and the wafer 200 may be vacuum-adsorbed by moving the stage ST toward the head HD, or the head HD and the wafer 200 may be vacuum-adsorbed by moving the head HD toward the wafer 200.

Next, referring to FIG. 4E, the head HD and/or the stage ST are moved in step S133. The head HD and the stage ST are spaced apart from each other to detach the wafer 200 and the donor substrate 300. Specifically, by moving the head HD, the stage ST, or the head HD and the stage ST away from each other, the wafer 200 fixed to the head HD and the donor substrate 300 of which a part is fixed to the stage ST may be detached. In this case, the wafer 200 and the donor substrate 300 may be detached by moving at least one of the head HD and the stage ST in a direction perpendicular to one surface of the stage ST, that is, in a Z-axis direction. For example, either the head HD or the stage ST may be moved in the Z-axis direction, or both the head HD and the stage ST may be moved in the Z-axis direction.

In this case, the entirety of one surface of the wafer 200 fixed to the head HD by the vacuum adsorption method may be maintained in a state attached to the head HD. On the other hand, in the donor substrate 300 of which only an edge or a corner is fixed to the stage ST, the remaining portion thereof that is not fixed to the stage ST and thus, configured to be movable may move along with the wafer 200 and the head HD. When moving the wafer 200 and the donor substrate 300 in directions away from each other in a state in which all of one surface of the wafer 200 is fixed to the head HD and only a portion among the outermost portions of the donor substrate 300 is fixed to the stage ST, the wafer 200 and the donor substrate 300 may be detached in a form in which they are separated line-by-line (hereinafter, it is referred as to "line-by-line separation").

For example, when the wafer 200 and the head HD are moved in the Z-axis direction in a state in which a right edge of the donor substrate 300 is fixed to the stage ST, the remaining portion of the donor substrate 300 that is bonded to the wafer 200 may move in the Z-axis direction along with the wafer 200 and the head HD. First, when the wafer 200 and the head HD start to move in the Z-axis direction, the right edge of the donor substrate 300 that is not movable along with the wafer 200 may be first separated. And, as the head HD and the wafer 200 gradually move away from the donor substrate 300, the donor substrate 300 may be sequentially separated from the wafer 200, from start with a portion thereof adjacent to the right edge of the donor substrate 300. Finally, a left edge of the donor substrate 300 is separated from the wafer 200, and the detachment of the wafer 200 and the donor substrate 300 may be completed. Therefore, the plurality of light emitting diodes LED that are adhered to the plurality of chip protrusions 331 of the donor substrate 300 may be separated from the wafer 200 on a line-by-line basis.

Meanwhile, the remaining portion of the donor substrate 300 that is not physically fixed to the stage ST moves along with the wafer 200 during the detachment process and is lifted from the stage ST, and when the detachment is completed, it may be seated on the stage ST. In this case, a vertical impact may be applied to the donor substrate 300 and the plurality of light emitting diodes LED. However, since the plurality of light emitting diodes LED adhered to the plurality of chip protrusions 331 of the donor substrate 300 are very resistant to the vertical impact, even if the donor substrate 300 is lifted from the stage ST during the process, a possibility of transfer defects of the plurality of light emitting diodes LED is low.

And, in order to reduce interference between the dams DM of the wafer 200 and light emitting diodes LED disposed at the outermost portions of the active area 200A in a line-by-line separation process, distances between the dams DM and the light emitting diodes LED may be formed to be equal to or greater than a distance from an outer portion of one light emitting diode LED to an outer portion of another light emitting diode LED adjacent thereto. As described above, when the wafer 200 and the donor substrate 300 are detached, the plurality of light emitting diodes LED may be separated from the wafer 200 on a line-by-line basis. At this time, if sufficient distances are not secured between the dam DM and the active area 200A, in a process in which the dams DM and the light emitting diodes LED at the outermost portions of the active area 200A that are transferred to the donor substrate 300 are sequentially separated, the light emitting diodes LED at the outermost portions and the dams DM of the wafer 200 may be interfered. In the case of a surface separation method in which entire surfaces of the donor substrate 300 and the wafer 200 are separated at once (hereinafter, it is referred as to "surface separation"), the light emitting diodes LED at the outermost portions and the dams DM may not be interfered. However, in the LED transfer method and the manufacturing method of the display device 100 using the same according to an exemplary embodiment of the present disclosure, since the wafer 200 and the donor substrate 300 are detached in a line-by-line separation method, interference may occur between the dams DM and the light emitting diodes LED at the outermost portions where the line-by-line separation is finally carried out, which may lead to transfer defects of the plurality of light emitting diodes LED. Therefore, sufficient distances are secured between the dams DM of the outer area 200B of the wafer 200 and the plurality of light emitting diodes LED of the active area 200A, so that it is possible to reduce interference between the dams DM and the plurality of light emitting diodes LED when the wafer 200 and the donor substrate 300 are detached.

Meanwhile, when fixing a portion among the outermost portions of the donor substrate 300 to the stage ST by the vacuum adsorption method instead of physically fixing, it may be disadvantageous in terms of process time and yield. In the case of vacuum-adsorbing edges of the donor substrate 300 partially, the line-by-line separation may be possible. However, when a detachment speed of the wafer 200 and the donor substrate 300 is increased, since the speed and adhesion are proportional to each other, adhesion between the wafer 200 and the donor substrate 300 may increase, and it may be difficult to maintain a strong vacuum pressure enough to fix the donor substrate 300. Conversely, when the detachment speed of the wafer 200 and the donor substrate 300 is reduced, the adhesion is relatively low, so that non-transfer defects of the plurality of light emitting diodes LED may increase, and the process time may also increase. Accordingly, when the donor substrate 300 is fixed by the vacuum adsorption method, it is disadvantageous in terms of process time and transfer yield, so a portion among the outermost portions of the donor substrate 300 may be physically fixed to the stage ST.

Referring to FIG. 4F, the plurality of light emitting diodes LED may be disposed on the donor substrate 300 by completing the primary transfer process. In this case, the plurality of light emitting diodes LED disposed on the donor substrate 300 may be radially disposed around one light emitting diode LED' among the plurality of light emitting diodes LED.

Specifically, one light emitting diode LED' among the plurality of light emitting diodes LED may be disposed at a center of the chip protrusion 331 of the donor substrate 300. In addition, as the light emitting diodes LED are farther away from one light emitting diode LED' centered on the one light emitting diode LED', they may be disposed to be spaced apart from the centers of the chip protrusions 331. For example, the light emitting diode LED adjacent to one light emitting diode LED' may be disposed adjacent to the center of the chip protrusion 331, and the light emitting diode LED disposed away from one light emitting diode LED' may be disposed to be spaced apart from the center of the chip protrusion 331. For example, some light emitting diodes LED disposed rightward of one light emitting diode LED' may be disposed to be deviated rightward from the centers of the chip protrusions 331, and some light emitting diodes LED disposed upward of one light emitting diode LED' may be disposed to be deviated upward from the centers of the chip protrusions 331.

In this case, one light emitting diode LED' may vary depending on a portion of the donor substrate 300 that is fixed to the stage ST. For example, when the right edge of the donor substrate 300 is fixed to the stage ST, one light emitting diode LED' may be one of the light emitting diodes LED disposed in a left area from the center of the donor substrate 300. Specifically, when the donor substrate 300 and the wafer 200 are detached from each other, the greatest tension may act on the right edge of the donor substrate 300 that is physically fixed to the stage ST and an area adjacent to the right edge. That is, when the donor substrate 300 and the wafer 200 are detached, the tension acting on the donor substrate 300 may vary depending on the fixed portion, and due to variances in tension, the plurality of light emitting diodes LED may be transferred radially on the plurality of chip protrusions 331. Therefore, when the donor substrate 300 and the wafer 200 are detached in the form in which they are separated line-by-line after physically fixing only one end of the donor substrate 300, the plurality of light emitting diodes LED disposed on the donor substrate 300 can be radially distributed.

Figure 4G:
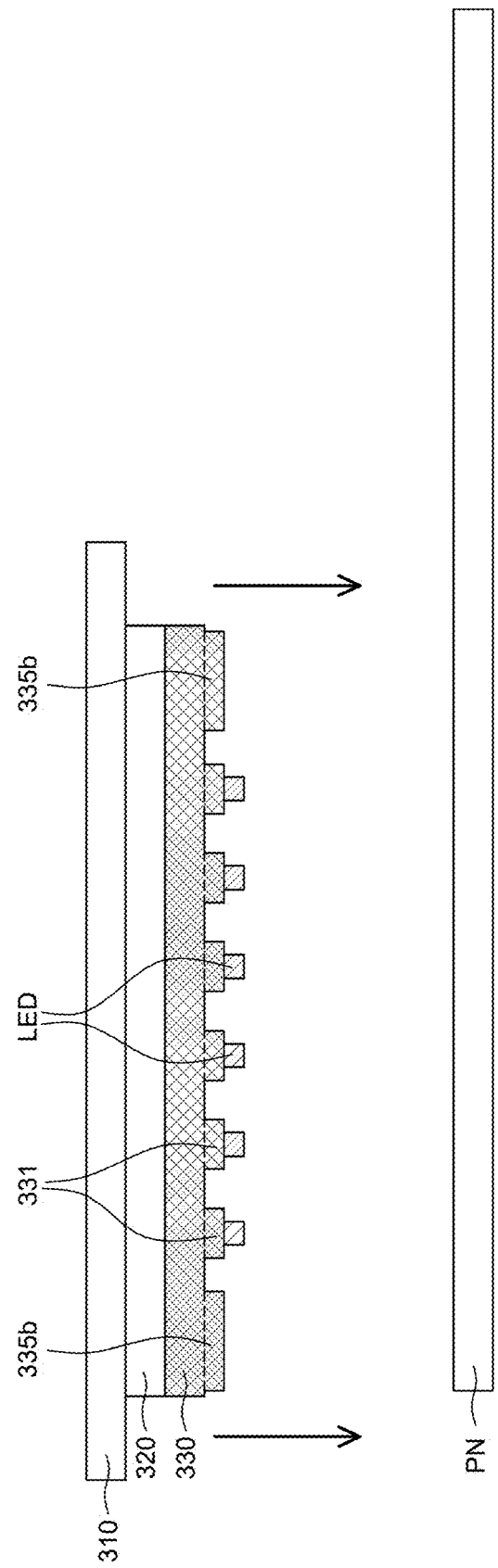

Finally, referring to FIG. 4G, by performing the secondary transfer process, the plurality of light emitting diodes LED on the donor substrate 300 may be transferred to the display panel PN to thereby complete the manufacturing process of the display device 100. In this case, the display panel PN is a circuit for driving the plurality of light emitting diodes LED, for example, a display panel PN in which forming of the driving transistor 120 and the plurality of lines is completed.

First, the donor substrate 300 on which the plurality of light emitting diodes LED are disposed and the display panel PN are put into process equipment. Next, the donor substrate 300 and the display panel PN are aligned.

In this case, the donor substrate 300 and the display panel PN may be aligned based on the second alignment keys AK2 that are transferred from the wafer 200 to the donor substrate 300 and alignment keys of the display panel PN.

The plurality of light emitting diodes LED and the second alignment keys AK2 disposed on the donor substrate 300 are transferred in the same process. Therefore, relative positions of the plurality of light emitting diodes LED and the second alignment keys AK2 may be constant. Therefore, when the donor substrate 300 and the display panel PN are aligned based on the second alignment keys AK2 of which the relative positions with respect to the plurality of light emitting diodes LED are constant, alignment accuracy capable of transferring the plurality of light emitting diodes LED in positions can be improved. Accordingly, when the plurality of light emitting diodes LED of the donor substrate 300 are transferred to the display panel PN, the donor substrate 300 and the display panel PN can be aligned based on the second alignment keys AK2. However, in the present disclosure, it has been described that the donor substrate 300 and the display panel PN are aligned based on the second alignment keys AK2, but the donor substrate 300 and the display panel PN may be aligned based on other components, and the present disclosure is not limited thereto.

The alignment key of the display panel PN aligned with the second alignment key AK2 on the donor substrate 300 may be any one of components formed on the display panel PN, or may be separately formed and disposed. For example, when the alignment key is any one of the components formed on the display panel PN, a reflective layer overlapping the plurality of light emitting diodes LED among the components formed on the display panel PN, some lines among a plurality of lines disposed to drive the plurality of light emitting diodes LEDs, or the like may function as the alignment key. Also, in a case in which the alignment key is separately formed and disposed, the alignment key may be a pattern or a structure formed on the display panel PN, but is not limited thereto.

Next, after alignment of the donor substrate 300 and the display panel PN is completed, the donor substrate 300 and the display panel PN are bonded together in step S140. Next, the plurality of light emitting diodes LED are transferred to the display panel PN in step S150. Then, after the plurality of light emitting diodes LED of the donor substrate 300 are transferred to the display panel PN, the donor substrate 300 and the display panel PN are detached in step S160. In this case, the plurality of light emitting diodes LED radially distributed on the donor substrate 300 may be radially distributed even after being transferred to the display panel PN.

In this case, the donor substrate 300 and the display panel PN may be detached in the line-by-line separation method as in FIG. 4E, or may be detached in another manner. For example, the donor substrate 300 and the display panel PN may be detached in a surface separation method in which entire surfaces thereof are separated at once, and the donor substrate 300 and the display panel PN may be detached in various manners.

Accordingly, the manufacturing process of the display device 100 may be completed through processes of primarily transferring the plurality of light emitting diodes LED from the wafer 200 to the donor substrate 300, and secondarily transferring the plurality of light emitting diodes LED that are transferred from the donor substrate 300 to the display panel PN.

Meanwhile, in some cases, as the donor substrate, a rigid substrate other than a flexible substrate may be used. For example, the donor substrate may be formed of a hard material instead of a material such as PDMS. However, when the donor substrate is a rigid substrate, it is difficult to configure the donor substrate in a large area due to a thickness variation, and there is a problem in that the number of transfers increases. On the other hand, when the donor substrate 300 is formed of a flexible substrate, the area of the donor substrate 300 may be increased and damage to the light emitting diodes LED may be minimized. Accordingly, in the LED transfer method and the manufacturing method of the display device 100 using the same according to an exemplary embodiment of the present disclosure, a flexible substrate may be used as the donor substrate 300.

Meanwhile, when the wafer 200 is detached from the donor substrate 300, which is a flexible substrate, in the surface separation method, transfer defects of the plurality of light emitting diodes LED may occur. For example, in order to detach the donor substrate 300 and the wafer 200 in the surface separation method, the detachment process may be performed in a state in which an entirety of one surface of the donor substrate 300 is fixed to the stage ST and an entirety of one surface of the wafer 200 is fixed to the head HD. At this time, when the donor substrate 300, which is a flexible substrate, is fixed to the stage ST by the vacuum adsorption method, a wrinkle phenomenon may occur in the donor substrate 300, which may cause transfer defects of the plurality of LEDs. The wrinkle phenomenon is a phenomenon in which a surface of the donor substrate 300 formed of a flexible material becomes uneven by an external force such as vacuum adsorption force. In addition, surface tension generated during the surface separation or external force caused by vacuum adsorption affects the light emitting diode LED of a tiny size, so that the light emitting diode LED may be transferred in a state in which it is overturned or tilted, or may be transferred in a rotated state. Such transfer defects may occur randomly in a surface separation area SA, which may lead to a decrease in yield and an increase in process cost.

On the other hand, in the LED transfer method according to an exemplary embodiment of the present disclosure, since only one end of the donor substrate 300, which is a flexible substrate, is physically fixed, external force due to vacuum adsorption can be minimized, and since the donor substrate 300 is naturally separated line-by-line from the wafer 200 even in the detachment process, the surface tension can be minimized. Specifically, one end of the donor substrate 300, which is a flexible substrate, may be physically fixed to the stage ST, and the wafer 200, which is a rigid substrate, may be fixed by vacuum adsorption to the head HD. And, the donor substrate 300 and the wafer 200 may be separated by moving the donor substrate 300, the wafer 200 or the donor substrate 300 and the wafer 200 in a vertical direction. In this case, since one end of the donor substrate 300 is physically fixed and the remaining portion thereof is not fixed, the remaining portion of the donor substrate 300 may move along with the wafer 200. However, as the distance between the wafer 200 and the donor substrate 300 increases, the donor substrate 300 may be sequentially separated from the wafer 200, from start with the one end of the donor substrate 300 that is fixed to the stage ST. Therefore, in the process of detaching the donor substrate 300 and the wafer 200, external force affecting the plurality of light emitting diodes LED is reduced, and thus, transfer defects of the plurality of light emitting diodes LED can be minimized. Accordingly, in the LED transfer method and the manufacturing method of the display device 100 using the same according to an exemplary embodiment of the present disclosure, the wafer 200 and the donor substrate 300 are detached in the line-by-line separation method, so it is possible to reduce transfer defects of the plurality of light emitting diodes LED.

In addition, in the LED transfer method and the manufacturing method of the display device 100 using the same according to an exemplary embodiment of the present disclosure, non-transfer defects of the plurality of light emitting diodes LED may be reduced by increasing the detachment speed of the wafer 200 and the donor substrate 300. A material such as PDMS constituting the plurality of chip protrusions 331 of the donor substrate 300 has a characteristic that adhesion increases in accordance with an increase in detachment speed. Therefore, when the detachment speed of the donor substrate 300 and the wafer 200 is increased, the adhesion of the chip protrusions 331 may be increased to improve attaching force of the plurality of light emitting diodes LED that are attached to the chip protrusions 331. Accordingly, non-transfer defects of the plurality of light emitting diodes LED may be reduced by detaching the wafer 200 and the donor substrate 300 in a high speed of line-by-line separation method, and at the same time, it is possible to minimize a phenomenon in which the plurality of light emitting diodes LED are transferred in a state of being overturned or tilted.

Hereinafter, the LED transfer method according to an exemplary embodiment of the present disclosure and LED transfer methods according to comparative embodiment will be compared with reference to FIG. 5A to FIG. 6B.

Figure 5A:
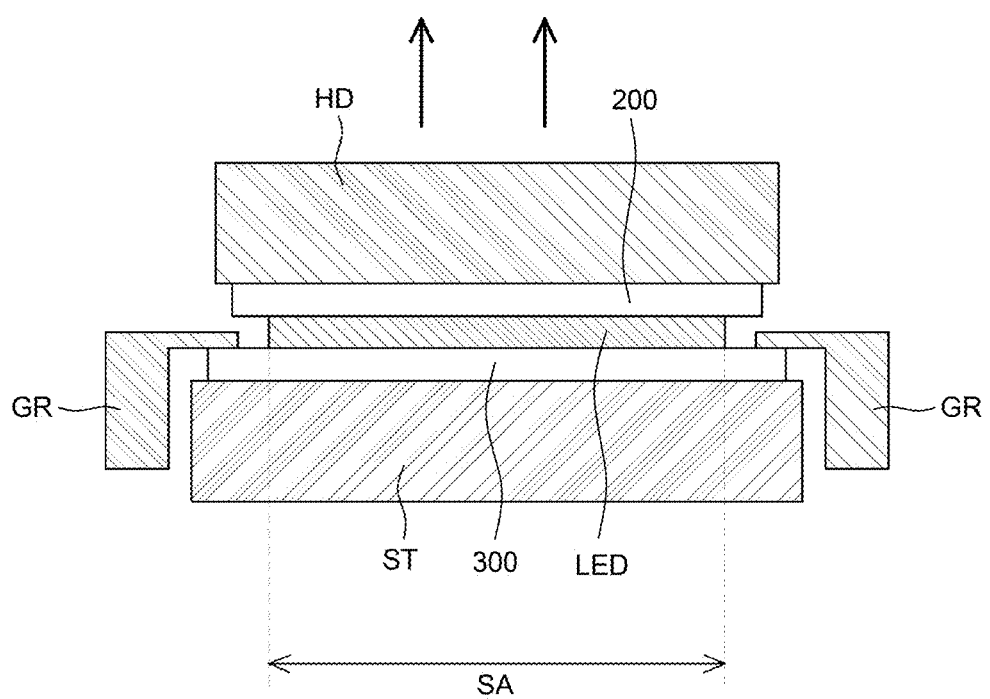
FIG. 5A and FIG. 5B are schematic views for explaining an LED transfer method according to Comparative Example 1.
Figure 5B:
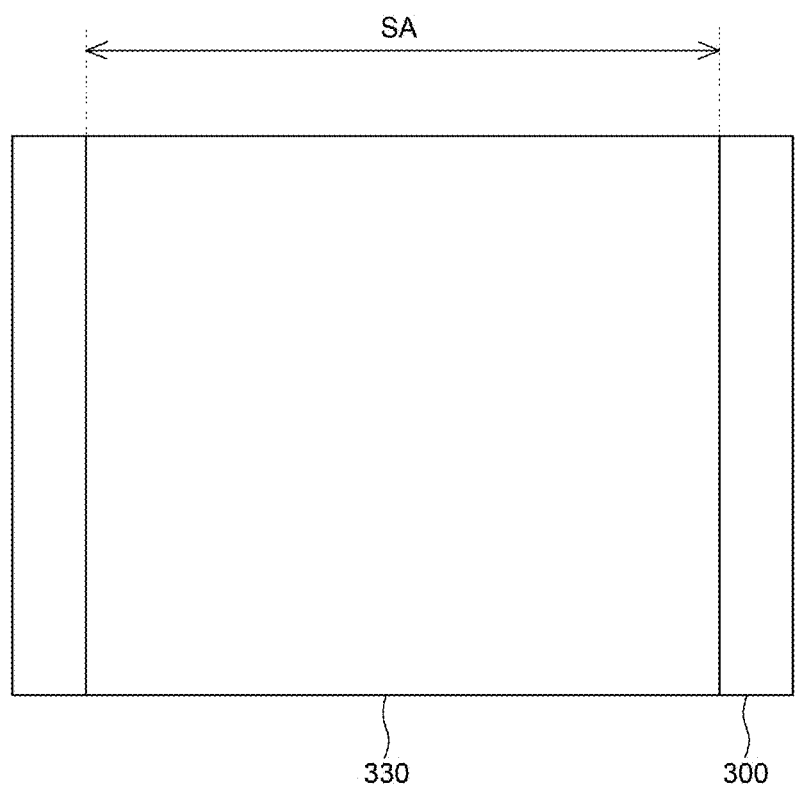
Figure 6A:
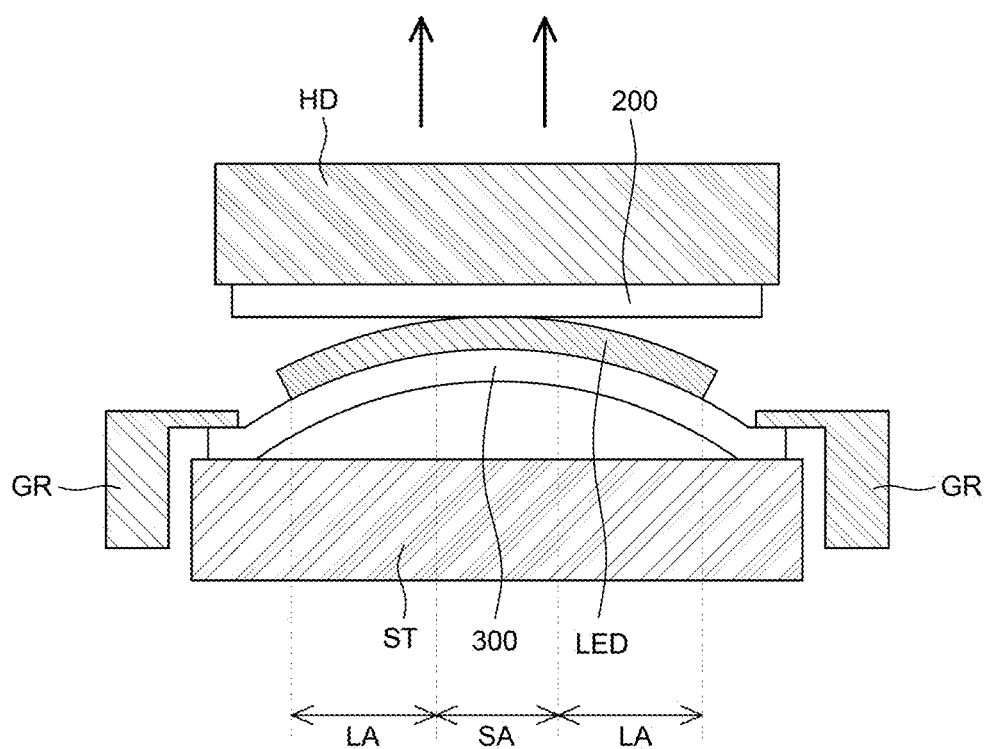
FIG. 6A and FIG. 6B are schematic views for explaining an LED transfer method according to Comparative Example 2.
Figure 6B:
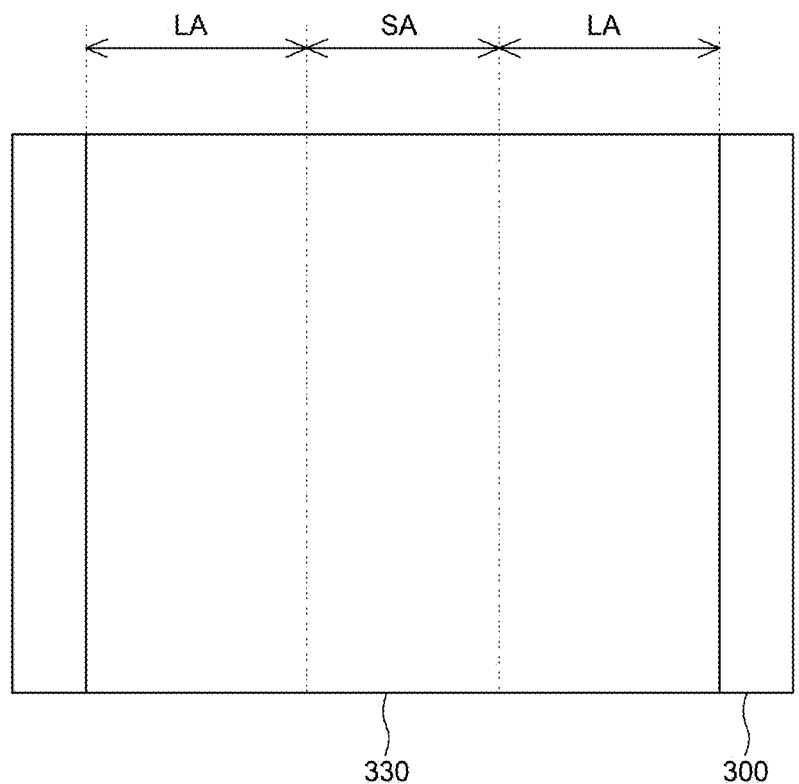

FIG. 5A and FIG. 5B are schematic views for explaining an LED transfer method according to Comparative Embodiment 1. FIG. 6A and FIG. 6B are schematic views for explaining an LED transfer method according to Comparative Embodiment 2. For convenience of explanation, only the base layer 310 and the resin layer 330 of the donor substrate 300 are illustrated in FIG. 5B and FIG. 6B.

The LED transfer method according to Comparative Embodiment 1 is a transfer method of separating the donor substrate 300 and the wafer 200 in a state in which the donor substrate 300 is fixed to the stage ST using both the fixing member GR and the vacuum adsorption method. The LED transfer method according to Comparative Embodiment 2 is a transfer method of separating the donor substrate 300 and the wafer 200 in a state in which both sides of the donor substrate 300 are fixed to the stage ST using only the fixing member GR.

First, referring to FIG. 5A and FIG. 5B, in the LED transfer method according to Comparative Embodiment 1, both edges of the donor substrate 300 are fixed to the stage ST by the fixing member GR in a state in which the entirety of one surface of the donor substrate 300 is vacuum-adsorbed to the stage ST. Then, the entirety of one surface of the wafer 200 is fixed to the head HD by the vacuum adsorption method.

Then, the wafer 200 and the donor substrate 300 may be moved away from each other to thereby detach the wafer 200 and the donor substrate 300. At this time, since the entirety of one surface of the donor substrate 300 is fixed to the stage ST, and the entirety of one surface of the wafer 200 is also fixed to the head HD, surface separation of the donor substrate 300 and the wafer 200 may be carried out. That is, an entire surface of the resin layer 330 of the donor substrate 300 may be the surface separation area SA. Therefore, transfer defects of the plurality of light emitting diodes LED may occur in the entirety of the resin layer 330 on which the plurality of chip protrusions 331 of the donor substrate 300 are disposed.

Referring to FIG. 6A and FIG. 6B, in the LED transfer method according to Comparative Embodiment 2, only both edges of the donor substrate 300 are fixed to the stage ST by the fixing member GR. Then, the entirety of one surface of the wafer 200 is fixed to the head HD by the vacuum adsorption method.

Then, the wafer 200 and the donor substrate 300 may be moved away from each other to thereby detach the wafer 200 and the donor substrate 300. At this time, since only both edges of the donor substrate 300 are fixed to the stage ST, and the entirety of one surface of the wafer 200 is fixed to the head HD, detachment may be made in the line-by-line separation method, from the both edges of the donor substrate 300 to a partial inner area of the donor substrate 300. However, a central area of the donor substrate 300 that is finally detached may be detached from the wafer 200 in the surface separation method. Therefore, in the resin layer 330 on which the plurality of chip protrusions 331 are disposed, partial areas extending from both edges may be line-by-line separation areas LA, and a remaining area in a middle thereof may be the surface separation area SA.

Therefore, in the LED transfer methods according to Comparative Embodiment 1 and Comparative Embodiment 2, at least a portion of the donor substrate 300 may be the surface separation area SA, and a probability of transfer defects of the plurality of light emitting diodes LED that is generated in the surface separation area SA may increase. That is, compared with the LED transfer method according to an exemplary embodiment of the present disclosure, the LED transfer methods according to Comparative Embodiment 1 and Comparative Embodiment 2 may be disadvantageous in terms of yield due to an increase in the surface separation area SA of the donor substrate 300. Therefore, in the LED transfer method according to an exemplary embodiment of the present disclosure, the stage ST and/or the head HD is moved in a state in which only one end of the donor substrate 300, which is a flexible substrate, is physically fixed to the stage ST and one surface of the wafer 200 is vacuum-adsorbed to the head HD, so that the entire area of the donor substrate 300 may be the line-by-line separation areas LA, thereby reducing transfer defects of the plurality of light emitting diodes LED.

The exemplary embodiments of the present disclosure can also be described as follows:

According to an aspect of the present disclosure, there is provided a light emitting diode (LED) transfer method. The light emitting diode (LED) transfer method includes bonding a rigid substrate on which a plurality of light emitting diodes are formed and a flexible substrate, transferring the plurality of light emitting diodes to the flexible substrate, and detaching the rigid substrate and the flexible substrate. The detaching of the rigid substrate and the flexible substrate includes separating the rigid substrate and the flexible substrate in a state in which one surface of the rigid substrate is fixed and a portion among outermost portions of the flexible substrate is fixed by a fixing member.

The detaching of the rigid substrate and the flexible substrate may further include loading the rigid substrate and the flexible substrate in the bonding state on a stage.

The detaching of the rigid substrate and the flexible substrate may further include fixing one edge among a plurality of edges of the flexible substrate to the stage by the fixing member. A remaining portion of the flexible substrate may be configured to be movable on the stage.

The detaching of the rigid substrate and the flexible substrate may further include fixing at least one corner among a plurality of corners of the flexible substrate to the stage by the fixing member. A remaining portion of the flexible substrate may be configured to be movable on the stage.

The detaching of the rigid substrate and the flexible substrate may further include moving the rigid substrate, the flexible substrate, or the rigid substrate and the flexible substrate in a direction perpendicular to one surface of the stage.

In the detaching of the rigid substrate and the flexible substrate, the rigid substrate and the flexible substrate may be separated line-by-line.

The plurality of light emitting diodes disposed on the flexible substrate may be radially disposed around one light emitting diode among the plurality of light emitting diodes. The one light emitting diode may be spaced apart from a center of the flexible substrate.

According to another aspect of the present disclosure, there is a manufacturing method of a display device. The manufacturing method of a display device includes bonding a wafer and a donor substrate, transferring a plurality of light emitting diodes of the wafer to the donor substrate, detaching the wafer and the donor substrate, bonding the donor substrate on which the plurality of light emitting diodes are disposed and a display panel, transferring the plurality of light emitting diodes of the donor substrate to the display panel, and detaching the display panel and the donor substrate. The detaching of the wafer and the donor substrate includes detaching the wafer and the donor substrate in a state in which one surface of the wafer is fixed to a head and a portion among outermost portions of the donor substrate is fixed to a stage.

The wafer and the display panel may be rigid substrates, and the donor substrate is a flexible substrate.

The detaching of the wafer and the donor substrate further may include fixing one edge among the outermost portions of the donor substrate to the stage by a gripper.

The detaching of the wafer and the donor substrate may further include fixing at least one corner among the outermost portions of the donor substrate to the stage by a gripper.

The detaching of the wafer and the donor substrate may further include fixing one surface of the wafer to the head by a vacuum adsorption or fixing member.

The detaching of the wafer and the donor substrate may further include moving the head, the stage, or the head and the stage in a Z-axis direction. When the head, the stage, or the head and the stage are moved in the Z-axis direction, the plurality of light emitting diodes may be separated from the wafer on a line-by-line basis.

When the head, the stage, or the head and the stage are moved in the Z-axis direction, at least a portion of the donor substrate may be spaced apart from the stage.

The wafer may include an active area in which a plurality of light emitting diodes are formed, and an outer area in which one or more dams are formed. A Distances between the light emitting diodes disposed at outermost portions of the active area among the plurality of light emitting diodes and the dams may be equal to or greater than a distance from an outer edge of one light emitting diode to an outer edge of another light emitting diode adjacent to the one light emitting diode among the plurality of light emitting diodes.

The donor substrate may include a chip protrusion to which each of the plurality of light emitting diodes is adhered. One light emitting diode among the plurality of light emitting diodes transferred to the donor substrate may be disposed at a center of the chip protrusion. Another light emitting diode disposed on one side of the one light emitting diode among the plurality of light emitting diodes transferred to the donor substrate may be disposed to be biased toward one side from the center of the chip protrusion.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A manufacturing method of a display device, comprising:
    bonding a wafer and a donor substrate;
    transferring a plurality of light emitting diodes of the wafer to the donor substrate;
    detaching the wafer and the donor substrate;
    bonding the donor substrate on which the plurality of light emitting diodes are disposed and a display panel;
    transferring the plurality of light emitting diodes of the donor substrate to the display panel; and
    detaching the display panel and the donor substrate, wherein:
    the detaching of the wafer and the donor substrate includes detaching the wafer and the donor substrate in a state in which one surface of the wafer is fixed to a head, and a portion among outermost portions of the donor substrate is fixed to a stage; and
    the detaching of the wafer and the donor substrate further includes separating the plurality of light emitting diodes from the wafer on a line-by-line basis.

2. The manufacturing method of claim 1, wherein the donor substrate is more flexible than the wafer and the display panel.

3. The manufacturing method of claim 1, wherein the detaching of the wafer and the donor substrate further includes fixing one edge among the outermost portions of the donor substrate to the stage by a gripper.

4. The manufacturing method of claim 1, wherein the detaching of the wafer and the donor substrate further includes fixing at least one corner among the outermost portions of the donor substrate to the stage by a gripper.

5. The manufacturing method of claim 1, wherein the detaching of the wafer and the donor substrate further includes fixing one surface of the wafer to the head by vacuum adsorption or a fixing member.

6. The manufacturing method of claim 1, wherein the detaching of the wafer and the donor substrate further includes moving the head, the stage, or the head and the stage in a Z-axis direction, and
    wherein when the head, the stage, or the head and the stage are moved in the Z-axis direction, the plurality of light emitting diodes are separated from the wafer on the line-by-line basis.

7. The manufacturing method of claim 6, wherein when the head, the stage, or the head and the stage are moved in the Z-axis direction, at least a portion of the donor substrate is spaced apart from the stage.

8. The manufacturing method of claim 1, wherein the wafer includes,
- an active area in which the plurality of light emitting diodes are formed; and
- an outer area in which one or more dams are formed,
- wherein distances between the light emitting diodes disposed at outermost portions of the active area among the plurality of light emitting diodes and the dams are equal to or greater than a distance from an outer edge of one light emitting diode to an outer edge of another light emitting diode adjacent to the one light emitting diode among the plurality of light emitting diodes.

9. The manufacturing method of claim 1, wherein the donor substrate includes a chip protrusion to which each of the plurality of light emitting diodes is adhered,
- wherein one light emitting diode among the plurality of light emitting diodes transferred to the donor substrate is disposed at a center of the chip protrusion, and
- wherein another light emitting diode disposed on one side of the one light emitting diode among the plurality of light emitting diodes transferred to the donor substrate is disposed to be biased toward one side from the center of the chip protrusion.

10. The manufacturing method of claim 8, wherein the wafer further includes a plurality of alignment keys formed in the outer area, and
- wherein the plurality of alignment keys include first alignment keys used to align the wafer and the donor substrate and second alignment keys used to align the donor substrate and the display panel.

11. The manufacturing method of claim 1, wherein:
- the wafer includes a plurality of alignment keys disposed in an area not overlapping the plurality of light emitting diodes; and
- the plurality of alignment keys include: one or more first alignment keys used to align the wafer and the donor substrate; and one or more second alignment keys used to align the donor substrate and the display panel.

12. The manufacturing method of claim 11, wherein:
- the donor substrate includes one or more alignment protrusions;
- the wafer and the donor substrate are aligned based on alignment of the one or more first alignment keys of the wafer and the one or more alignment protrusions of the donor substrate; and
- a shape or a size of the one or more first alignment keys of the wafer is different from a shape or a size of the one or more alignment protrusions of the donor substrate.

13. The manufacturing method of claim 1, wherein:
- the wafer includes one or more dams disposed in an area not overlapping the plurality of light emitting diodes;
- the donor substrate includes one or more dam protrusions; and
- when the plurality of light emitting diodes of the wafer are transferred to the donor substrate, the one or more dam protrusions of the donor substrate come in contact with the one or more dams of the wafer.

14. The manufacturing method of claim 13, wherein at least a portion of the one or more dams of the wafer is formed concurrently with at least a portion of the plurality of light emitting diodes of the wafer.

* * * * *